(12) United States Patent
Lee et al.

(10) Patent No.: US 8,166,221 B2
(45) Date of Patent: Apr. 24, 2012

(54) LOW-POWER USB SUPERSPEED DEVICE WITH 8-BIT PAYLOAD AND 9-BIT FRAME NRZI ENCODING FOR REPLACING 8/10-BIT ENCODING

(75) Inventors: Charles C. Lee, Cupertino, CA (US);
Frank Yu, Palo Alto, CA (US);
Abraham C. Ma, Fremont, CA (US);
Jim Chin-Nan Ni, San Jose, CA (US);
Shimon Chen, Los Gatos, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 119 days.

(21) Appl. No.: 12/831,160

(22) Filed: Jul. 6, 2010

(65) Prior Publication Data

US 2010/0275037 A1  Oct. 28, 2010

Related U.S. Application Data

(63) Continuation-in-part of application No. 12/254,428, filed on Oct. 20, 2008, now Pat. No. 7,849,242, and a continuation-in-part of application No. 10/803,597, filed on Mar. 17, 2004, now Pat. No. 7,457,897, and a continuation-in-part of application No. 11/925,933, filed on Oct. 27, 2007, now abandoned, and a continuation-in-part of application No. 11/928,124, filed on Oct. 30, 2007, now Pat. No. 7,707,321, and a continuation-in-part of application No. 12/347,306, filed on Dec. 31, 2008, and a continuation-in-part of application No. 11/926,636, filed on Oct. 29, 2007, now Pat. No. 7,657,692, and a continuation-in-part of application No. 12/576,216, filed on Oct. 8, 2009, and a continuation-in-part of application No. 12/124,081, filed on May 20, 2008, now Pat. No. 7,872,873, and a continuation-in-part of application No. 11/927,549, filed on Oct. 29, 2007, now Pat. No. 7,440,286, and a continuation-in-part of application No. 11/874,767, filed on Oct. 18, 2007, now Pat. No. 8,021,166, and a continuation-in-part of application No. 12/608,842, filed on Oct. 29, 2009, now Pat. No. 7,844,763.

(51) Int. Cl.
*G06F 13/12* (2006.01)
*G06F 13/00* (2006.01)
(52) U.S. Cl. .......................................... 710/74; 711/100
(58) Field of Classification Search ...................... 710/74
See application file for complete search history.

(56) References Cited

U.S. PATENT DOCUMENTS

| | | | | |
|---|---|---|---|---|
| 6,467,042 B1 * | 10/2002 | Wright et al. | ................. | 713/320 |
| 7,137,564 B2 * | 11/2006 | Chen et al. | .................... | 235/492 |
| 7,421,594 B2 * | 9/2008 | Nakajima et al. | ............. | 713/300 |

* cited by examiner

*Primary Examiner* — Henry Tsai
*Assistant Examiner* — Juanito Borromeo
(74) *Attorney, Agent, or Firm* — Stuart T. Auvinen; gPatent LLC

(57) ABSTRACT

A Low-power flash-memory device uses a modified Universal-Serial-Bus (USB) 3.0 Protocol to reduce power consumption. The bit clock is slowed to reduce power and the need for pre-emphasis when USB cable lengths are short in applications. Data efficiency is improved by eliminating the 8/10-bit encoder and instead encoding sync and framing bytes as 9-bit symbols. Data bytes are expanded by bit stuffing only when a series of six ones occurs in the data. Header and payload data is transmitted as nearly 8-bits per data byte while framing is 9-bits per symbol, much less than the standard 10 bits per byte. Low-power link layers, physical layers, and scaled-down protocol layers are used. A card reader converter hub allows USB hosts to access low-power USB devices. Only one flash device is accessed, reducing power compared with standard USB broadcasting to multiple devices.

22 Claims, 23 Drawing Sheets

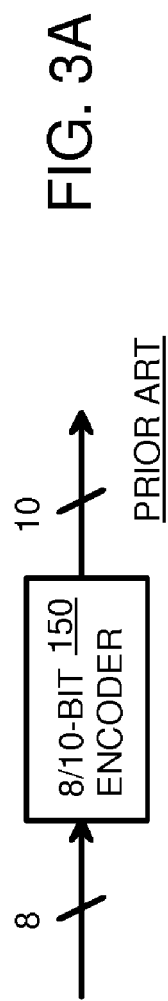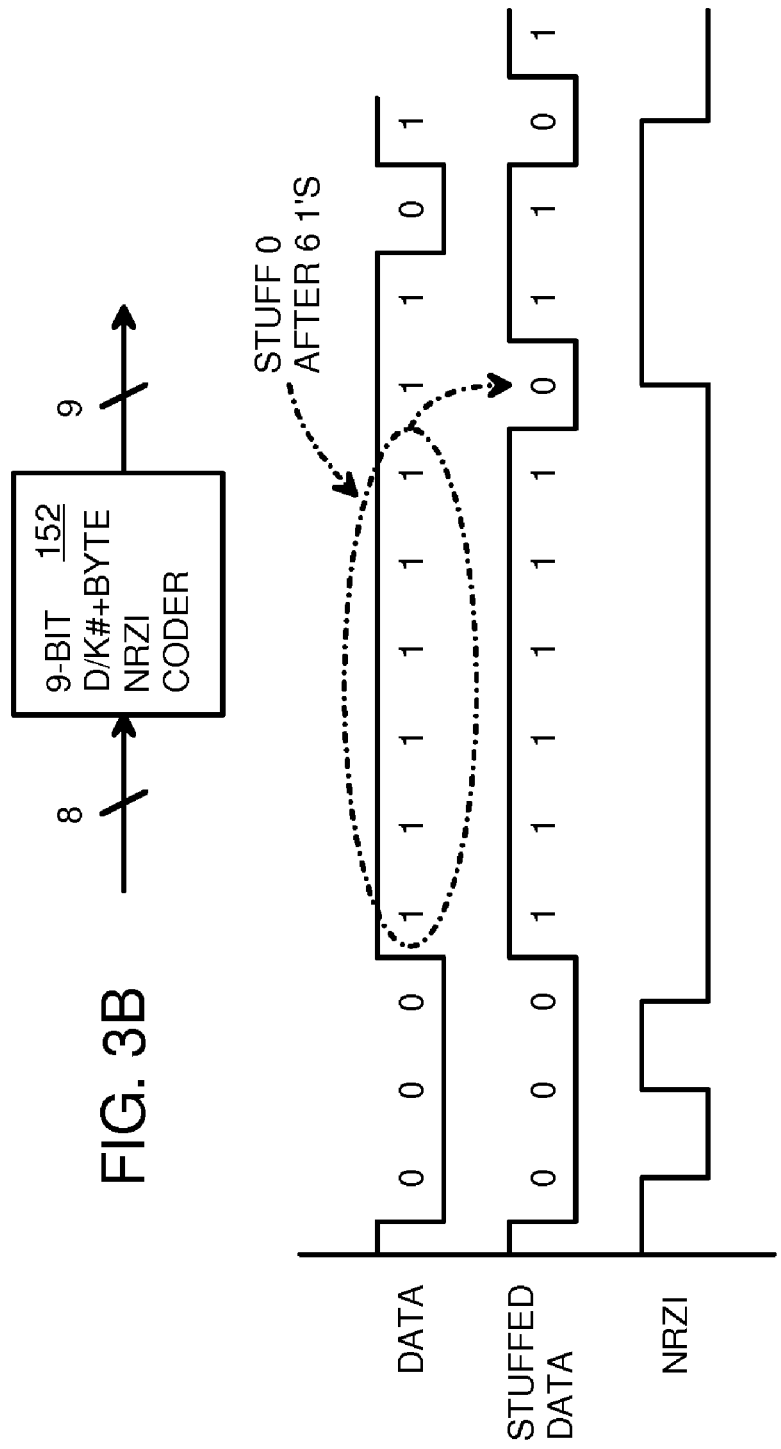

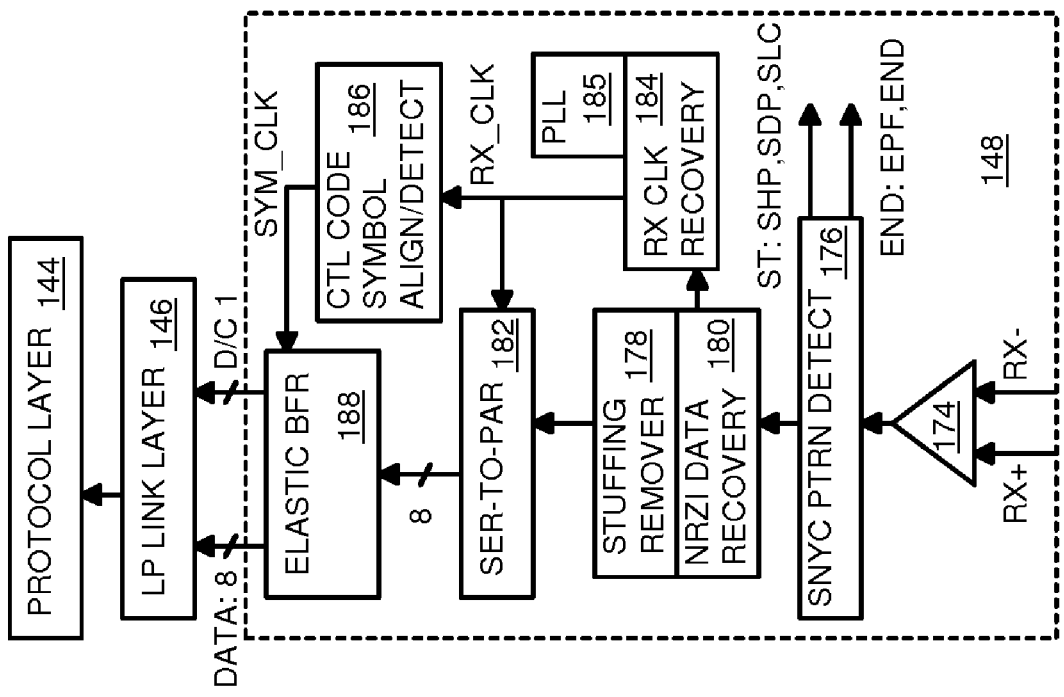
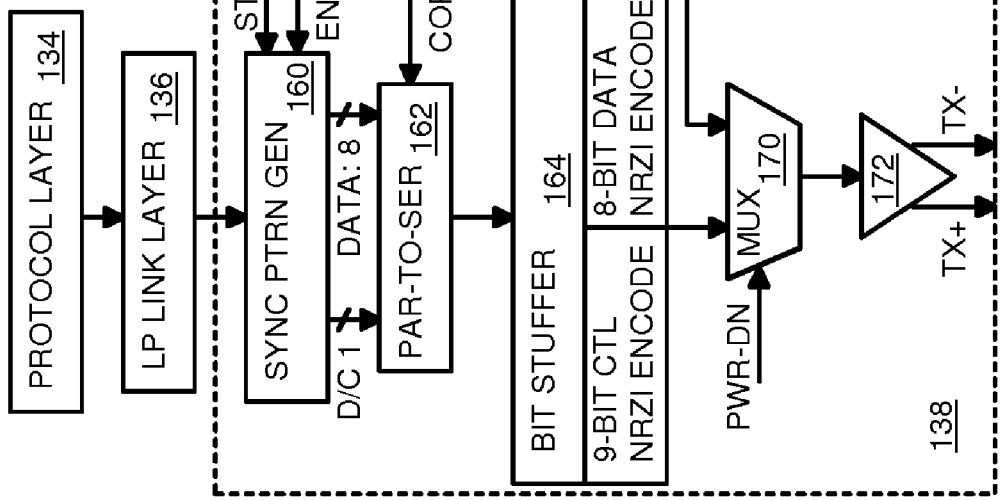
FIG. 4

LOW-POWER USB SUPERSPEED DEVICE WITH 8-BIT PAYLOAD AND 9-BIT FRAME NRZI ENCODING FOR REPLACING 8/10-BIT ENCODING

RELATED APPLICATION

This application is a continuation-in-part of the co-pending application for "PCI EXPRESS-COMPATIBLE CONTROLLER AND INTERFACE FOR FLASH MEMORY", U.S. Ser. No. 12/254,428, filed on Oct. 20, 2008, which is a Division of "PCI EXPRESS-COMPATIBLE CONTROLLER AND INTERFACE FOR FLASH MEMORY", U.S. application Ser. No. 10/803,597, filed on Mar. 17, 2004, now U.S. Pat. No. 7,457,897.

This application is also a CIP of the co-pending U.S. patent application for "Low-Power Extended USB Flash Device without Polling", U.S. application Ser. No. 11/925,933, filed on Oct. 27, 2007.

This application is a continuation-in-part (CIP) of co-pending U.S. patent application for "HIGH-LEVEL BRIDGE FROM PCIE TO EXTENDED USB" Ser. No. 11/926,636, filed on Oct. 29, 2007.

This application is also a CIP of co-pending U.S. patent application for "Chained DMA for Low-Power Extended USB Flash Device Without Polling", U.S. application Ser. No. 11/928,124, filed on Oct. 30, 2007.

This application is a CIP for "Swappable Sets of Partial-Mapping Tables in a Flash-Memory System With A Command Queue for Combining Flash Writes", Ser. No. 12/347,306, filed on Dec. 31, 2008.

This application is a CIP of "Flash-Memory System with Enhanced Smart-Storage Switch and Packed Meta-Data Cache for Mitigating Write Amplification by Delaying and Merging Writes until a Host Read" U.S. application Ser. No. 12/576,216, filed on Oct. 8, 2009.

This application is a CIP of "Extended COB-USB with Dual Personality Contacts" U.S. application Ser. No. 12/124,081, filed on May 20, 2008.

This application is a CIP of "Extended USB Dual-Personality Card Reader" U.S. application Ser. No. 11/927,549, filed on Oct. 29, 2007.

This application is a CIP of "Extended USB Plug, USB PCBA, and USB Flash Drive With Dual-Personality for Embedded Application with Mother Boards" U.S. application Ser. No. 11/874,767, filed on Oct. 18, 2007.

This application is also a CIP of "Differential data transfer for flash memory card" U.S. application Ser. No. 12/608,842, filed on Oct. 29, 2009.

FIELD OF THE INVENTION

This invention relates to computer peripheral systems, and more particularly to low-power Universal-Serial-Bus (USB) systems.

BACKGROUND OF THE INVENTION

Expansion and peripheral devices such as flash-memory and radio transceivers are often connected to a host such as a personal computer (PC) by an expansion or peripheral bus such as Universal-Serial-Bus (USB). Such peripherals may plug directly into a USB socket on the host, or may have a cable with a plug that fits into the host's USB connector socket.

Newer versions of peripheral standards such as USB 3.0 offer higher speed transfers through faster clock rates and more efficient framing and handshaking. Burst transfers may further improve throughput. Newer USB devices provide faster transfers when inserted into a host. The host may be able to detect USB devices and reduce throughput for these older devices when inserted into the more advanced host.

Some peripherals are very power sensitive. The peripheral may not have a power supply, or may use a battery. For these low-power peripherals, power consumption may be more important than speed. This may especially be true for flash-memory devices that are already limited in transfer speeds by the relatively slow access of the flash memory.

Some USB devices are embedded within the host system. The capacitance of the long USB cable is eliminated, replaced by a short cable, connector, or metal printed-circuit board (PCB) traces within the host, or even without a cable for directly plugging in. Since the USB standard is designed to drive a relatively long USB cable, when the cable is absent power is wasted when large-current drivers are still used to drive the short embedded cable, connector, or PCB traces.

Since memory on a USB device may be busy or slow, sometimes the host's request cannot be processed immediately. The host may send the request, then periodically poll the USB device to see whether the data is ready. Also, when the host is idle, the host may need to periodically poll the USB device to see if the USB device needs to transfer information to the host. This periodic polling may be used for other purposes as well, such as for polling a mouse for movement.

While polling is useful, since it allows the host to completely control the USB bus, power is consumed each time a packet is sent for polling. While this power is small, for low-power or battery-powered devices, the amount of power consumed may be significant and undesirable. Also, the USB device or host may otherwise be in a low-power sleep or suspend state, and have to wake up into a higher-power state to perform or respond to the polling. There may be significant time and energy required to wake up from the suspend or sleep state, and then to re-enter the suspend or sleep state once polling is done.

What is desired is a low-power peripheral that can be accessed by a high-speed host. It is desirable to reduce power consumption for low-power USB devices that are accessed by a USB host. It is desired to provide a low-power USB connection within the host enclosure to an embedded USB device.

BRIEF DESCRIPTION OF THE DRAWINGS

FIG. 3A shows a prior-art USB encoder.

FIG. 3B shows a 9-bit encoder.

FIG. 3C is a waveform of data encoding for low-power USB devices.

FIG. 4 highlights low-power physical layers.

DETAILED DESCRIPTION

The present invention relates to an improvement in low-power USB systems. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
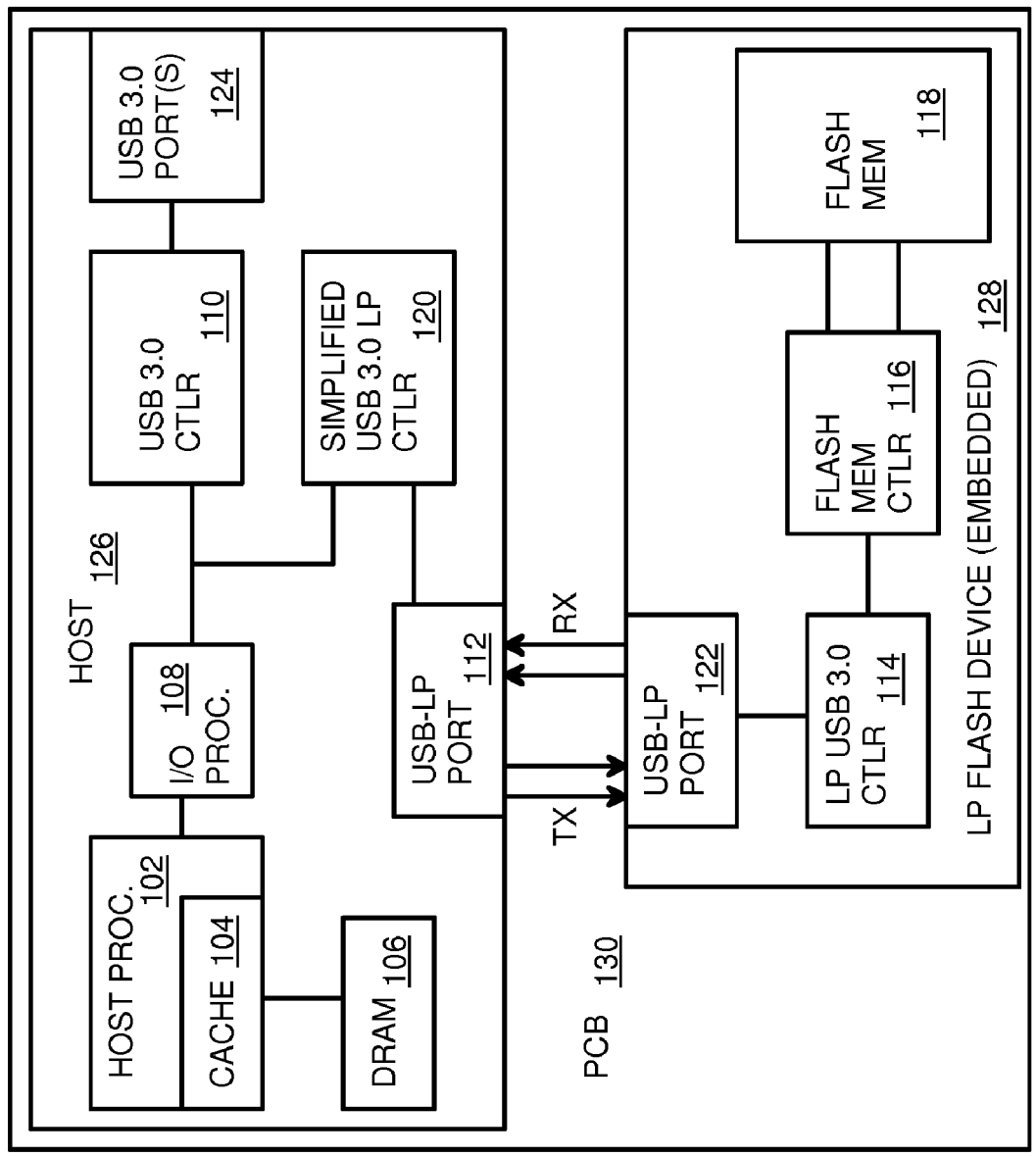
FIG. 1A is a block diagram of an embedded low-power flash device.

FIG. 1A is a block diagram of an embedded low-power flash device. Host 126 and low-power flash device 128 are both integrated onto the same PCB 130, such as a motherboard or other circuit board. Host 126 has host processor 102 with cache memory 104 that read data and instructions from dynamic-random-access memory (DRAM) 106, which acts as a main memory. Input-Output (I/O) processor 108 receives in and out commands from host processor 102 and activates USB 3.0 controller 110 when accessing peripherals connected to USB port 124, such as USB 3.0 and USB 2.0 peripherals.

I/O processor 108 also activates simplified USB 3.0 low-power controller 120 when accessing low-power flash device 128. Simplified USB 3.0 low-power controller 120 uses a simplified USB protocol to send and receive data on a transmit (TX) and receive (RX) pair between USB-LP port 112 on host 126 and USB-LP port 122 on low-power flash device 128. Since low-power flash device 128 is embedded on the same PCB 130 as host 126, a long USB cable is not needed between USB-LP ports 112, 122. Metal traces on PCB 130 may be used, or a short cable, connector, or jumper wires.

Low-power USB 3.0 controller 114 receives commands from host 126 and sends and receives data in response to those commands using USB-LP port 122. Flash memory controller 116 is activated to read data from flash memory 118 in response to read commands, and to write data into flash memory 118 in response to write commands.

If standard USB physical layers and ports were used for ports 112, 122, the high current drivers in the physical layer would be wasted on the short wire traces between ports 112, 122. Power consumption would be larger than necessary for the embedded USB link between ports 112, 122. The inventors have realized that using low-power USB controllers with ports 112, 122 can reduce power consumption on low-power flash device 128 and on simplified USB 3.0 low-power controller 120.

Figure 1B:
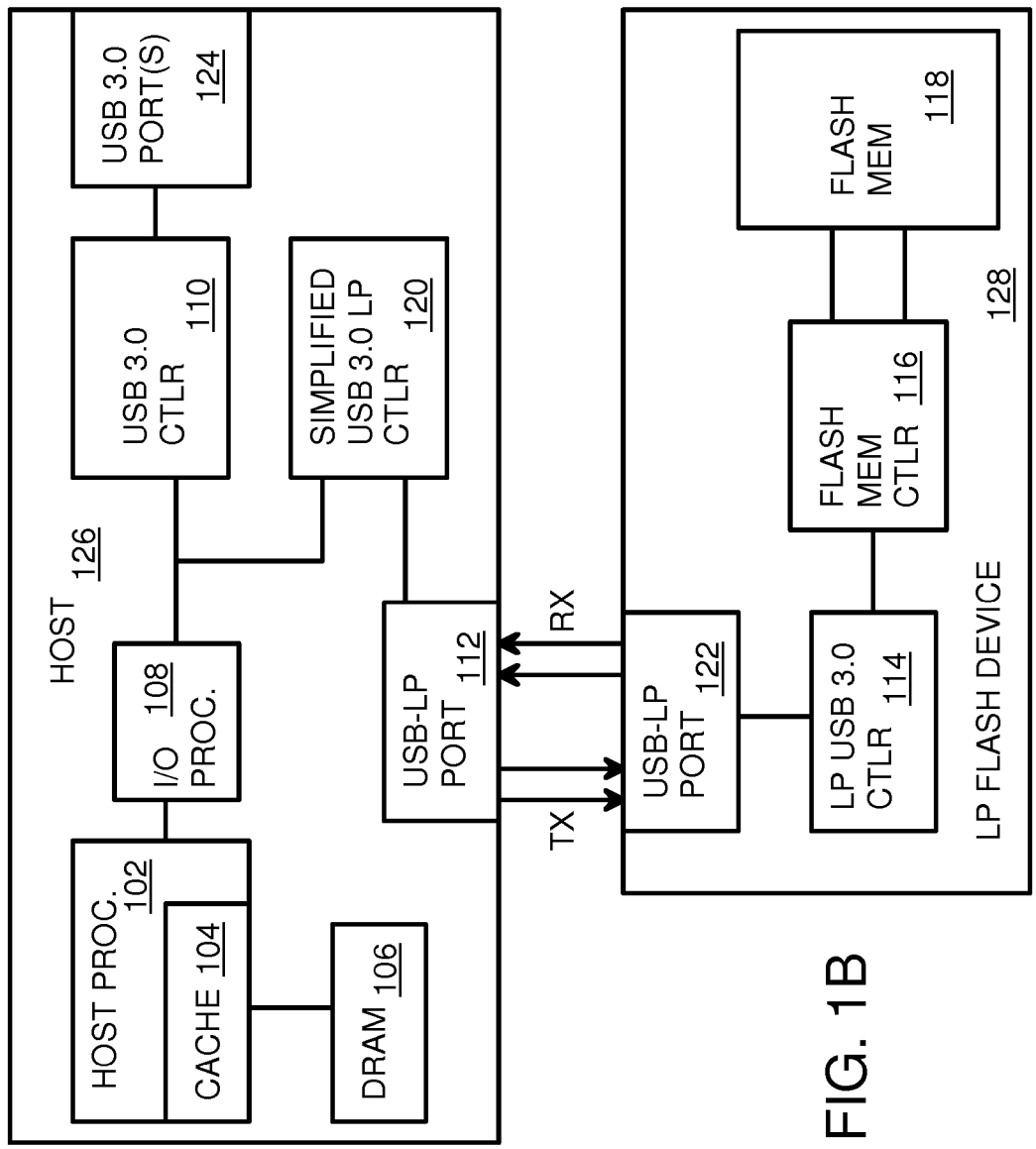
FIG. 1B is a block diagram of a low-power flash device connected to a host.

FIG. 1B is a block diagram of a low-power flash device connected to a host. Host 126 has host processor 102 with cache memory 104 that read data and instructions from dynamic-random-access memory (DRAM) 106, which acts as a main memory. Input-Output (I/O) processor 108 receives in and out commands from host processor 102 and activates USB 3.0 controller 110 when accessing peripherals connected to USB port 124, such as USB 3.0 and USB 2.0 peripherals.

I/O processor 108 also activates simplified USB 3.0 low-power controller 120 when accessing low-power flash device 128. Simplified USB 3.0 low-power controller 120 uses a simplified USB protocol to send and receive data on a transmit (TX) and receive (RX) pair between USB-LP port 112 on host 126 and USB-LP port 122 on low-power flash device 128.

Low-power USB 3.0 controller 114 receives commands from host 126 and sends and receives data in response to those commands using USB-LP port 122. Flash memory controller 116 is activated to read data from flash memory 118 in response to read commands, and to write data into flash memory 118 in response to write commands.

Figure 2:
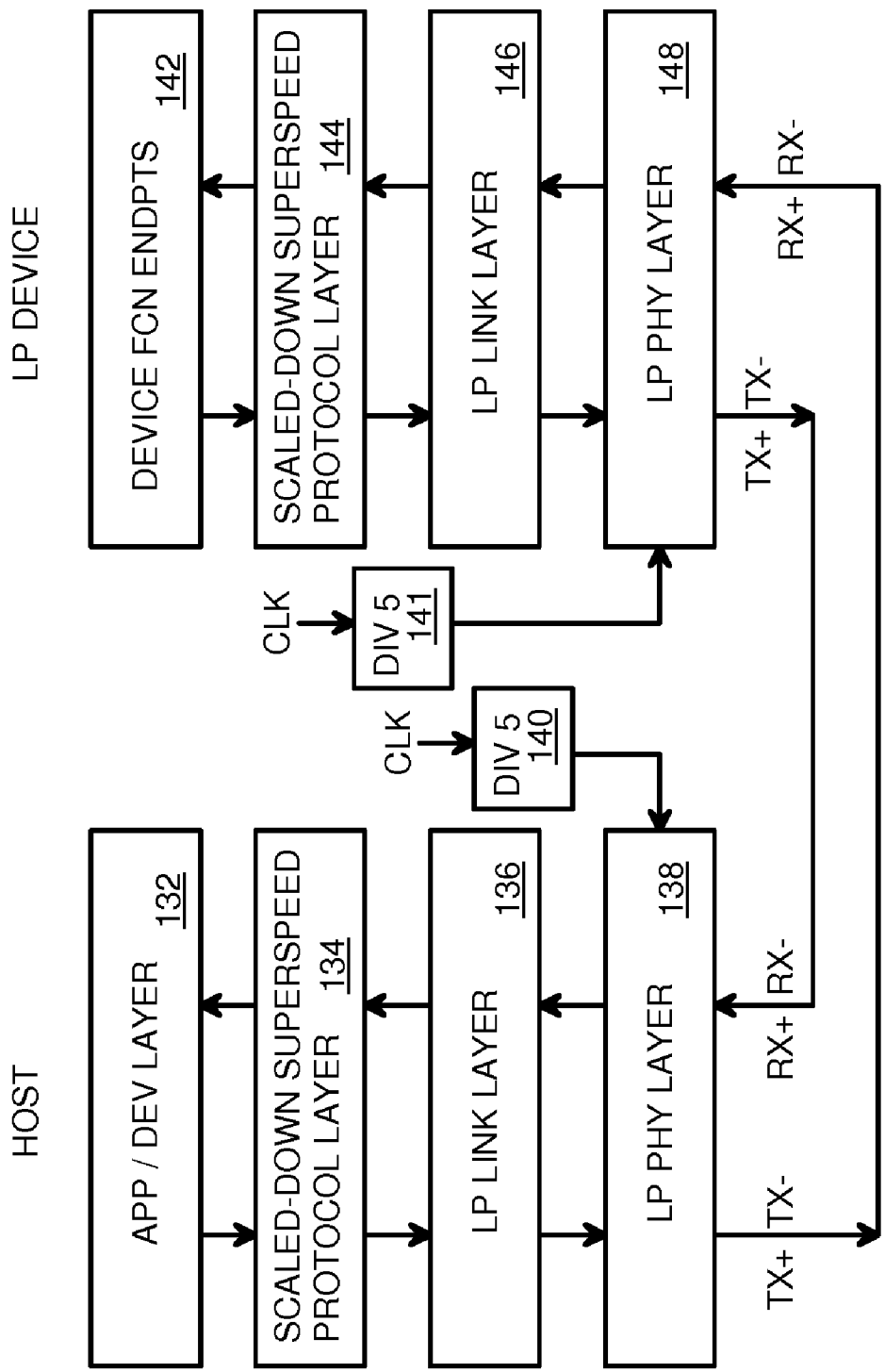
FIG. 2 highlights a host accessing a low-power USB device.

FIG. 2 highlights a host accessing a low-power USB device. Programs executing on the host generate commands to application or device layer 132 on the host. Application or device layer 132 digests program data into transaction packets and activates scaled-down protocol layer 134, which has a subset of the functionality of a full USB protocol layer. Low-power link layer 136 is called by scaled-down protocol layer 134 and provides linking to a single USB device rather than to many USB devices. Clock divider 140 reduces the USB clock by 5 and applies the slower clock to low-power physical layer 138. The reduced clock rate reduces power consumed by low-power physical layer 138. The line drivers in low-power physical layer 138 can be reduced since only one USB device is driven rather than many USB devices, and because the RX and TX pairs are embedded on the host's motherboard.

On the LP device, low-power physical layer 148 receives the physical signaling on the RX pair and drives the TX pair. Clock divider 141 reduces the device's USB clock by 5 and applies the slower clock to low-power physical layer 148. The reduced clock rate reduces power consumed by low-power physical layer 148. Low-power link layer 146 is a modified link layer that performs a subset of the USB link functions and passes packets up to scaled-down protocol layer 144. Data is passed to and from device function endpoints 142 by scaled-down protocol layer 144.

Since only one device endpoint is allowed, broadcast transactions are not needed. Scaled-down protocol layer 134 can be simplified. The efficient token/data/handshake sequences of USB 3.0 are still used, but only for linking to a single LP device rather than to many USB devices. The bulk pipe may be used for data bursting, and flow control is improved. The interrupt pipe is not needed if only mass storage class is supported by scaled-down protocol layer 134.

Bit Stuffing More Efficient than 8/10-Bit Encoding—FIG. 3

FIG. 3A shows a prior-art USB encoder. USB data is arranged as 8-bit bytes, which are then encoded as 10-bit words by 8/10-bit encoder 150. The 10-bit words are transmitted over the TX pair. Thus for each data byte, 10 bits are physically transmitted. The data is expanded by 25% using 8/10-bit encoder 150. The wider 10-bit words provide some error detection and protection against line errors. This protection is needed when transmitting over relatively long USB cables, but is not really needed for embedded devices that have very short TX and RX lines.

FIG. 3B shows a 9-bit encoder. For low-power embedded devices, the short TX and RX lines are less prone to noise and transmission errors than a long USB cable. Instead, framing bytes are encoded as 9-bit words, while data bytes are stuffed NRZI encoding. Coder 152 converts 8-bit framing bytes into 9-bit framing words for transmission. However, the data bytes are not all converted to 9-bit words. Instead, an extra bit is added only after a sequence of six one's occur when data bytes are converted to NRZI coding. Many data bytes do not have a sequenced of 6 ones in NRZI, and thus the data expansion is low, especially compared with 8/10 encoding. Thus a more efficient encoding is used for communicating with low-power USB devices.

FIG. 3C is a waveform of data encoding for low-power USB devices. A binary data sequence has 3 zeros followed by 8 ones, then a zero and a one. The sequence of 8 ones causes a zero bit to be stuffed after the first sequence of 6 ones, as shown by the middle waveform. Thus the example binary data sequence has been expanded from 13 binary bits to 14 binary bits. The stuffed data is converted to NRZI, with each binary 0 causing a data transition, and each binary 1 causing no transition. Stuffing the zero added a data transition to the NRZI data, allowing a Phase-locked loop (PLL) in the receiver to remain locked.

Thus data stuffing allows for clock recovery, but expands the data only slightly. While the amount of data expansion depends on the data itself, most sequences of random data should have an expansion of less that one bit per data byte. Since fewer bits are transmitted by the low-power USB controllers, power is reduced compared with standard USB that uses 8/10-bit encoding.

FIG. 4 highlights low-power physical layers. On the host, scaled-down protocol layer 134 connects to scaled-down protocol layer 134 which connects to low-power physical layer 138. On the LP device, low-power physical layer 148 sends an 8-bit data byte and a 1-bit data/command flag to low-power link layer 146, which passes data up to scaled-down protocol layer 144.

FIG. 4 is simplified. Only the transmit path is shown in low-power physical layer 138, and only the receive path is shown in low-power physical layer 148, but a transmit path similar to that in low-power physical layer 138 would be present in low-power physical layer 148, and a receive path similar to that shown in low-power physical layer 148 would be present in low-power physical layer 138.

Line driver 172 in low-power physical layer 138 drives the TX pair that is the same pair as the RX pair received by line receiver 174 in low-power physical layer 148. Line driver 172 can be a lower-power driver than in a standard USB physical layer since the TX lines are short when the LP USB device is embedded. A scrambler is not needed by low-power physical layer 138. A scrambler is normally used to smooth data to reduce EMI noise, but embedded devices have a very short bus which is not noisy.

In low-power physical layer 138, sync pattern generator 160 generates framing or sync patterns, such as a Start Header Packet (SHP), Start Data Packet (SDP), Start Link Command (SLC), End of Packet (END), and End Packet Framing (EPF). The data/command bit is set when sync pattern generator 160 generates a sync attern. Otherwise, data is passed through to parallel-to-serial converter 162, which converts the sync pattern or data word to serial binary data. A core clock is used by parallel-to-serial converter 162, and is also divided by 5 by clock divider 166 and applied as the bit clock to bit stuffer 164. Bit stuffer 164 performs bit stuffing on data as shown in FIG. 3C, inserting a zero bit after each series of six ones for data. A sequence of six ones does not occur in any of the valid sync patterns, except for SLC and END, which can be inverted. The 9-bit sync or control patterns and the 8-bit stuffed data are converted to NRZI data and applied to mux 170. Mux 170 passes the NRZI stream to line driver 172 when power-down mode is not active. When power down mode is active, signal generator 168 generates a low-frequency periodic signal or heartbeat that is sent through mux 170 to the TX pair. This low-frequency signal has a fixed pattern with a lower-than-normal clock period. This low-frequency signal is used for various special purposes, such as wake up, entering or exiting a training sequence, or other purposes with a pre-defined meaning.

Sync pattern detector 176 in low-power physical layer 148 examines the received data and signals when a sync pattern is detected. These sync patterns do not occur in normal data. Stuffing remover 178 removes stuffed bits and NRZI data recovery generates the data stream from the NRZI data.

Clock recovery 184 generates a receive clock from the NRZI data stream using PLL 185 and outputs a receive clock RX_CLK. This receive clock is applied to serial-to-parallel converter 182 which generates 8-bit parallel data words. These data words are stored in elastic buffer 188 and then sent to low-power link layer 146 as 8-bit data and one data/command bit. A symbol clock is generated from the receive clock by aligner 186. Aligner 186 detects sync patterns and control codes in the data stream using a high-frequency receive clock and a lower frequency symbol clock, and clocks words out of elastic buffer 188.

Figure 5:
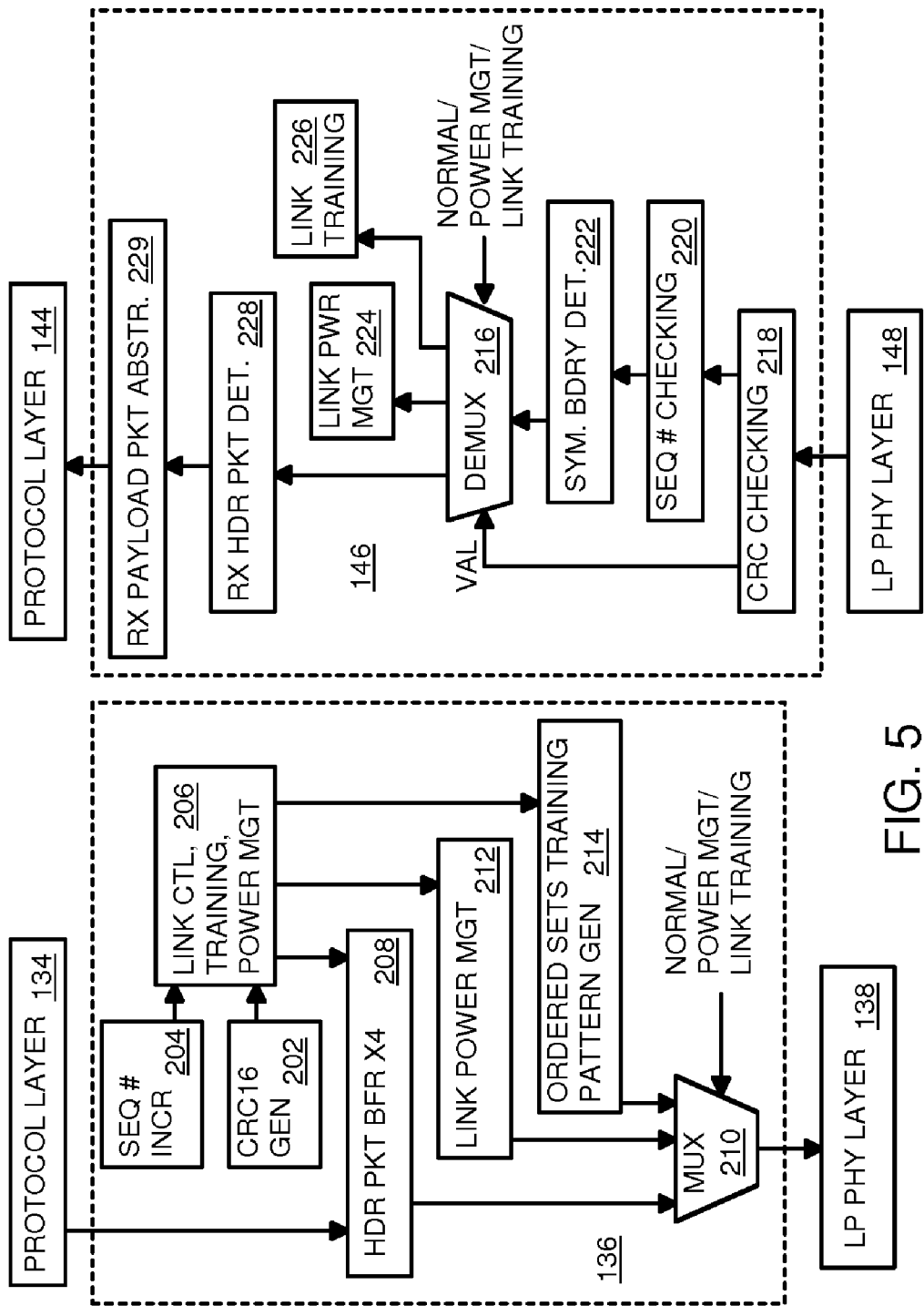
FIG. 5 highlights the low-power link layers.

FIG. 5 highlights the low-power link layers. Low-power link layer 136 is between scaled-down protocol layer 134 and low-power physical layer 138 on the transmit path, while low-power link layer 146 is between scaled-down protocol layer 144 and low-power physical layer 148 on the receive path. Only one direction path is show in FIG. 4 for simplicity but a real system would be bi-directional.

The link layers are simplified since only one downstream device is allowed. Sequence number incrementer 204 and CRC16 generator 202 may be eliminated from low-power link layer 136. Up to four header packets can be stored in header buffer 208. These headers can be modified by link controller 206, such as by setting and resetting bits in the headers in header buffer 208. These headers are selected by mux 210 during normal mode for transmission by low-power physical layer 138.

Link controller 206 also performs link training by activating ordered sets training pattern generator 214 to generate patterns for link training. These training patterns are transmitted when mux 210 is set to link training mode. Power management commands are generated by link power management 212 and selected by mux 210 for transmission during power management mode.

On the receiver side, CRC checker 218 checks incoming cyclical-redundancy-check (CRC) codes, while sequence number checker 220 checks sequence numbers. Symbol boundary detector 222 detects symbol boundaries, and valid symbols are sent through demux 216 to receive header packet detector 228 in normal mode, to link power manager 224 in power management mode, and to link training 226 in training mode. Payload data is abstracted by abstractor 229 once the header is detected and located. Abstractor 229 sends packets up to scaled-down protocol layer 144.

Figure 6:
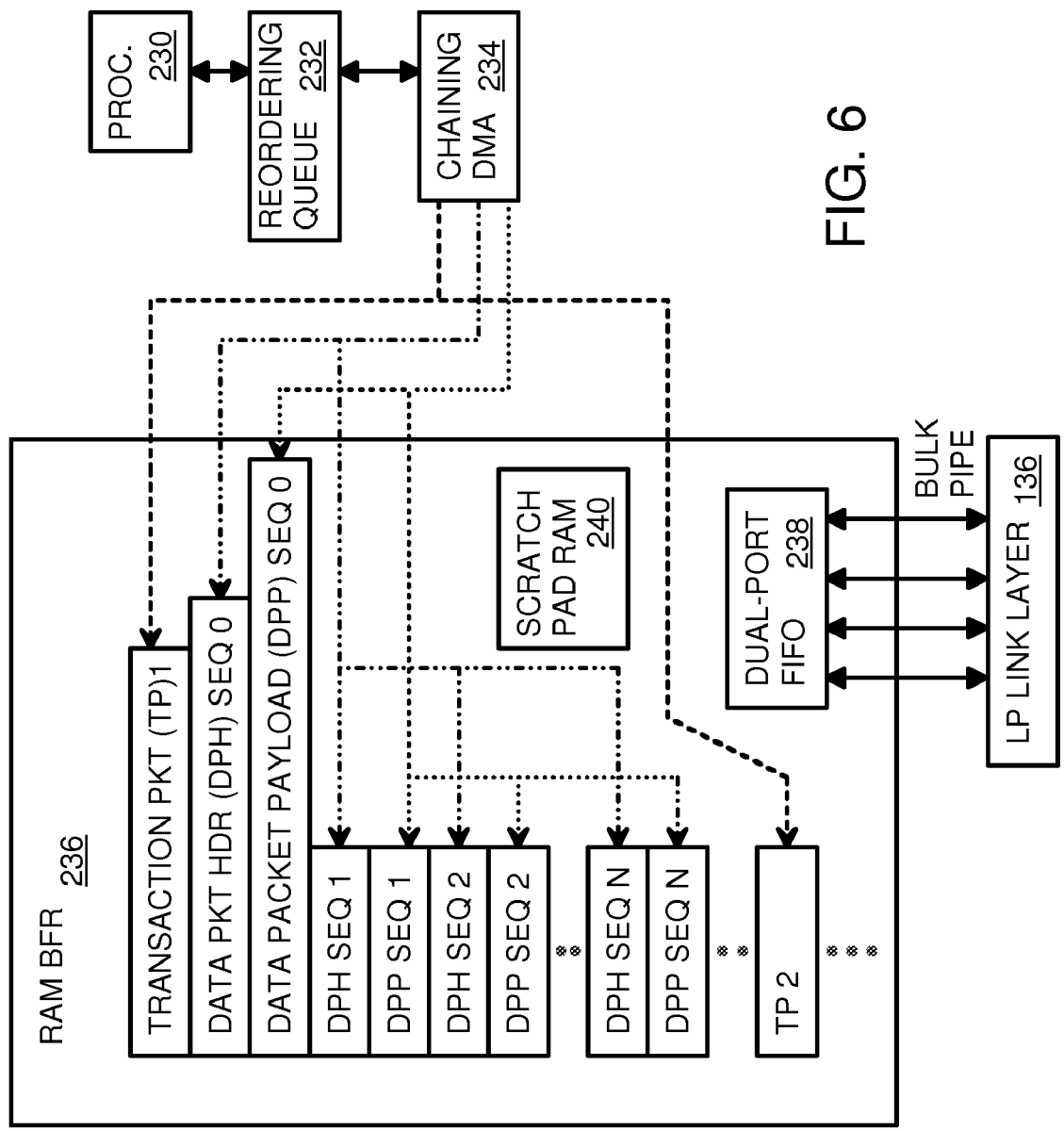
FIG. 6 highlights operation of scaled-down protocol layer 134.

FIG. 6 highlights operation of scaled-down protocol layer 134. A bulk pipe to low-power link layer 136 is created by dual-port FIFO 238, which can be part of RAM buffer 236. Scratch pad RAM 240 can be used by a flash memory control processor or for some other purpose.

Scaled-down protocol layer 134 is implemented as instructions executing on processor 230, which uses reordering queue 232 to reorder commands and data. Chaining direct-memory access (DMA) 234 stores pointers to headers and packets in RAM buffer 236 that are to be transmitted. For example, chaining DMA 234 points to transaction packet 1 (TP1), then to Data Packet Header (DPH) sequence 0, then to Data Packet Payload (DPP) sequence 0, then to DPH Seq 1, DPP Seq 1, DPH Seq 2, DPP Seq 2, etc. and then for all DPH and DPP in transaction packet 2. These packet headers and payloads are then transferred to dual-port FIFO 238 for transmission to Low-power link layer 136. A reverse DMA chaining occurs on the receive path.

Figure 7:
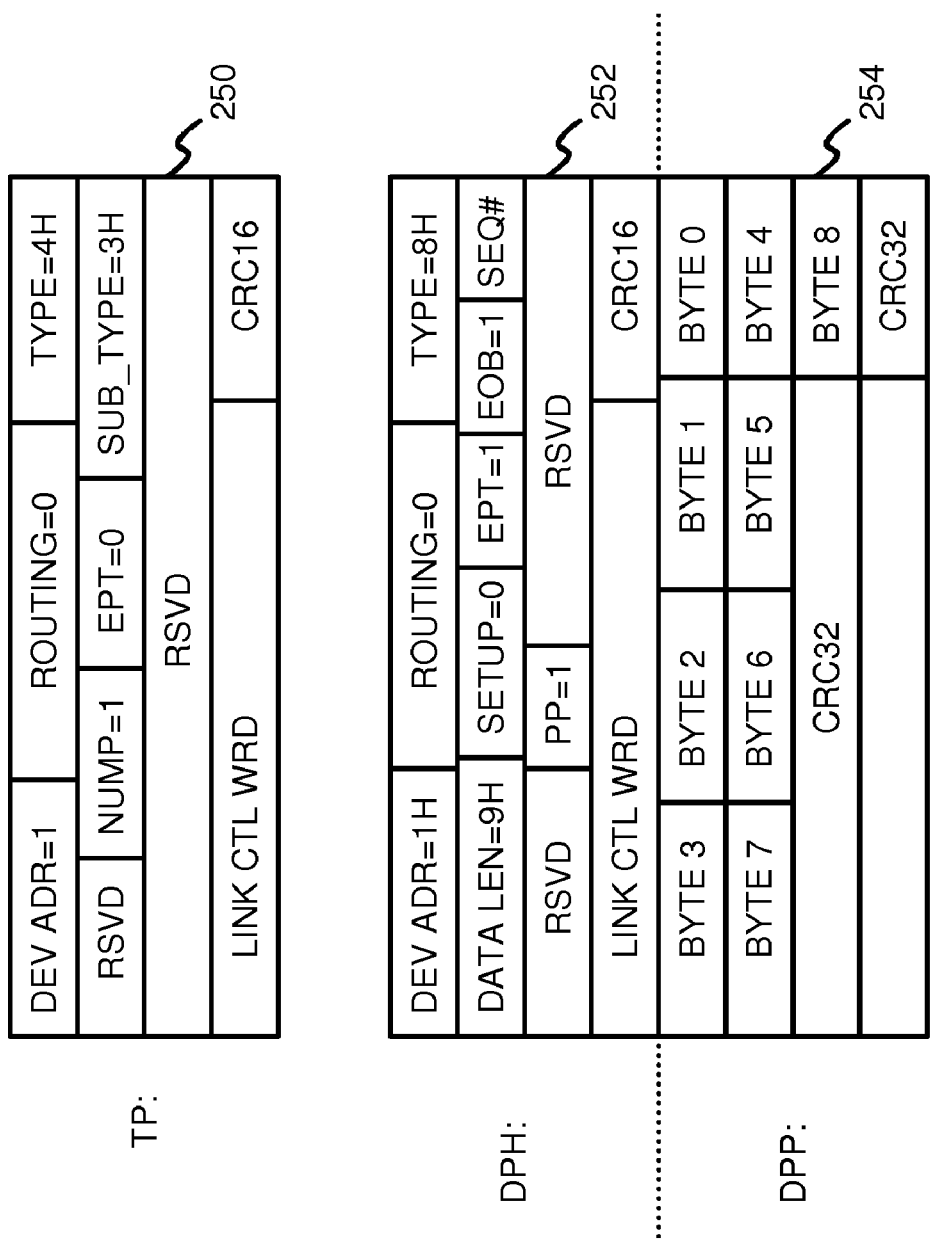
FIG. 7 shows low-power packet formats.

FIG. 7 shows low-power packet formats. The USB formats are simplified for low-power applications. The Transaction Packet (TP) has the device address set to 1, since there is only one downstream device allowed. Routing information is not needed since only 1 destination exists on the low-power USB. The endpoint number (EPT) is set to 0. The transaction type, number of packets to transfer, sub-type, and other information are as with standard USB. The link control word and CRC16 finish TP 250.

The Data Packet Header (DPH) has the device address set to 1, since there is only one downstream device allowed. Routing information is not needed since only 1 destination exists on the low-power USB. The endpoint number (EPT) is set to 1 for data endpoints; 0 is reserved for control endpoints. The transaction type, number of payload bytes to transfer, and other information are as with standard USB. The link control word and CRC 16 finish the TP.

The Data Packet Payload (DPP) 254 follows DPH 252. Data bytes are transferred up to the number of bytes in the data length field in the DPH. A CRC32 finishes the DPP.

Figure 8A:
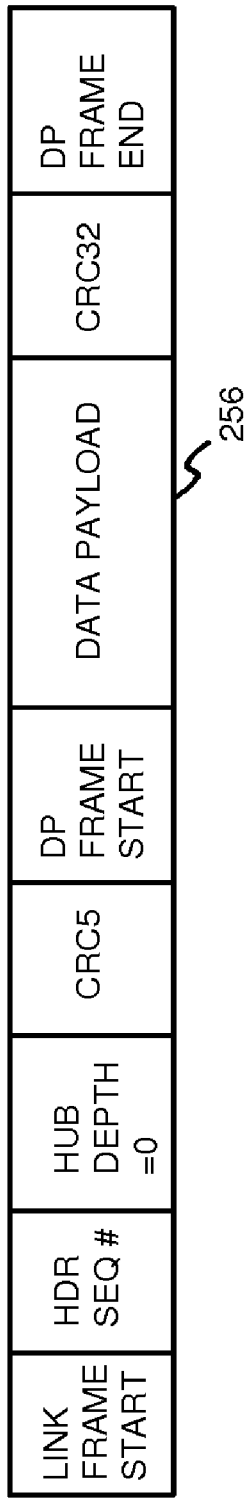
FIG. 8A shows a simplified low-power link layer packet.

FIG. 8A shows a simplified low-power link layer packet. Simplified link layer packet 256 begins with a link frame start pattern. This is the SLC sync pattern of FIG. 9. A link control word follows. The link control word has a header sequence number, a hub depth that is set to zero, and a 5-bit CRC5.

Then a data packet frame start pattern (SDP) occurs to signal the beginning of the data payload. The data bytes in the data payload follow. A 32-bit CRC of the data payload is transmitted before the DP frame end pattern (EPF).

Figure 8B:
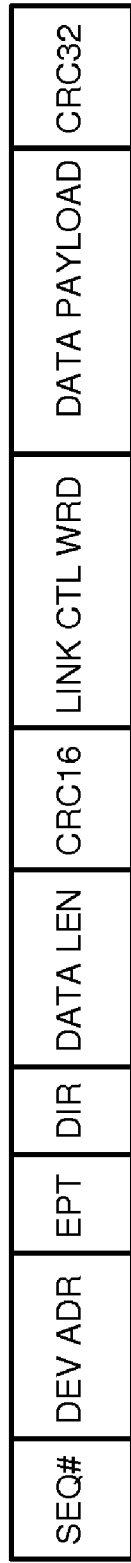
FIG. 8B shows a simplified low-power USB 3.0 packet.

FIG. 8B shows a simplified low-power USB 3.0 physical layer packet. Simplified low-power USB 3.0 packet 258 begins with a sequence number. The device address set to 1, since there is only one downstream device allowed. Routing information is not needed since only 1 destination exists on the low-power USB. The endpoint number (EPT) is set to 0. The direction DIR is set or cleared depending on whether the transaction is a read or write.

The data length is the number of packets to transfer. A CRC16 for the header is followed by the link control word, data payload, and CRC32 that were part of Simplified link layer packet 256 of FIG. 8A. In some embodiments, the CRC and sequence numbers are only in the link-layer packet encapsulated within the physical layer packet.

Figure 9:
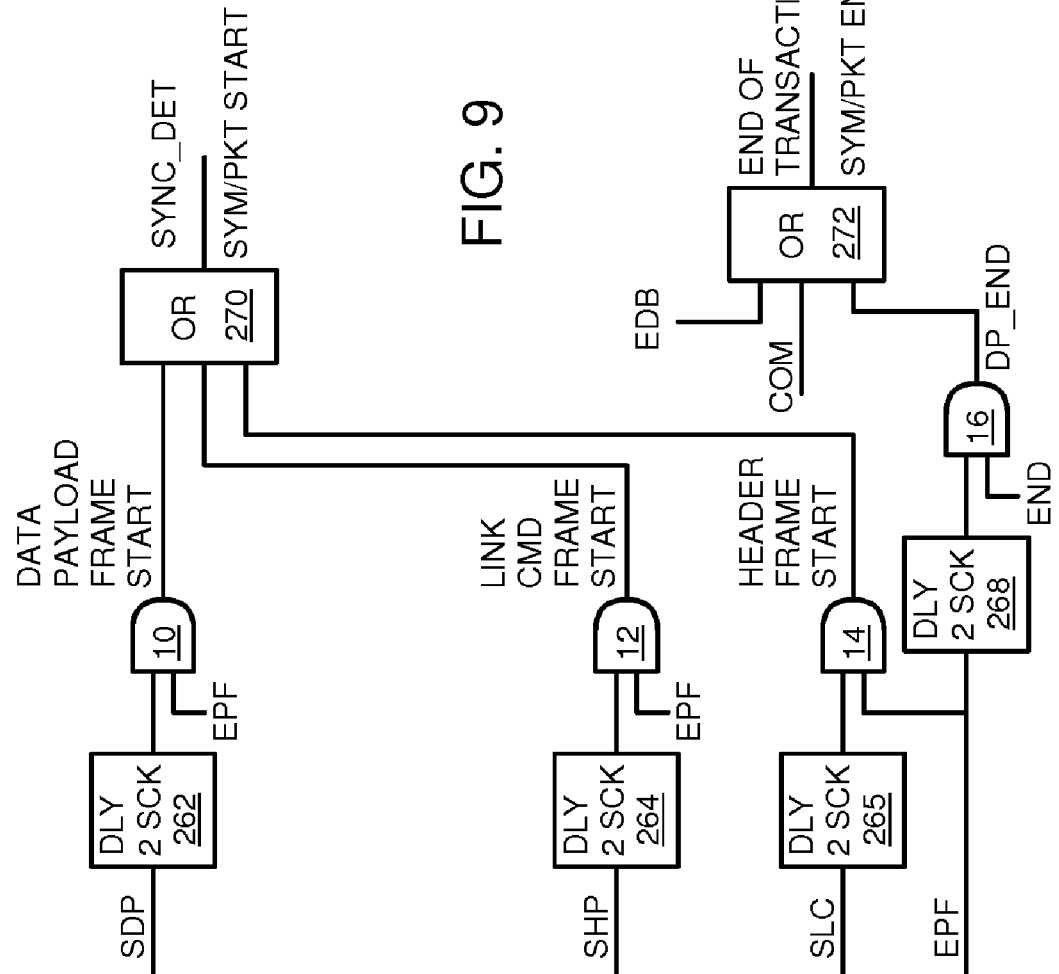
FIG. 9 shows sync patterns and logic.

FIG. 9 shows sync patterns and logic. Table 260 is a list of special symbols that are used for alignment of the data stream and framing. Some symbols indicate the start of headers or payloads or link commands, such as Start Header Packet (SHP), Start Data Packet (SDP), Start Link Command (SLC). Other symbols indicate the end of packets and frames, such as End of Packet (END) and End Packet Framing (EPF). Other symbols are for error handling, such as the skip, end bad, decode error substitution symbols.

Each special symbol corresponds to a command. The symbols all have an initial bit set to 1, the K#/D or data/command bit, and an 8-bit code, for a total of 9 bits per symbol. The receiver can quickly distinguish between data and symbols by examining the K#/D bit.

When the receiver decodes a 9-bit pattern (1:5C) that matches the second row in table 260, a Start Data Packet (SDP) is detected and signaled by a symbol decoder in the receiver. The SDP signal is delayed by two symbol clocks by delay 262 and ANDed with End Packet Framing (EPF) by AND gate 10 to signal the start of the data payload. A sync detect is also generated by OR gate 270. EPF occurs 2 symbol clocks after SDP, as shown later in FIG. 12. A symbol clock is 9 bit clocks or receive clocks (FIG. 4) since the symbols are 9 bits.

When the receiver decodes a 9-bit pattern (1:FB) that matches the sixth row in table 260, a Start Header Packet (SHP) is detected and signaled by a symbol decoder in the receiver. The SHP signal is delayed by two clocks by delay 264 and ANDed with End Packet Framing (EPF) by AND gate 12 to signal the start of the link command in a header packet. A sync detect is also generated by OR gate 270. EPF occurs 2 symbol clocks after the first SHP, as shown later in FIG. 12.

When the receiver decodes a 9-bit pattern (1:FE) that matches the eighth row in table 260, a Start Link Command (SLC) is detected and signaled by a symbol decoder in the receiver. The SLC signal is delayed by two clocks by delay 265 and ANDed with End Packet Framing (EPF) by AND gate 14 to signal the start of the header frame. A sync detect is also generated by OR gate 270. EPF occurs 2 symbol clocks after the first SLC in a link command packet, as shown later in FIG. 12.

The link command packet has exactly two link command words for data protection purposes (FIG. 12), so the link command packet ends two symbol clocks after it is detected. Delay 268 signals the end of the link command packet. AND gate 16 combines this with the End of Packet symbol (END) to signal DP_END, which should be sent at the end of the link command packet. OR gate 272 signals the end of transactions, symbols, and packets when table 260 decodes an End Bad (EDB), Comma (COM), or DP_END from AND gate 16.

Figure 10:
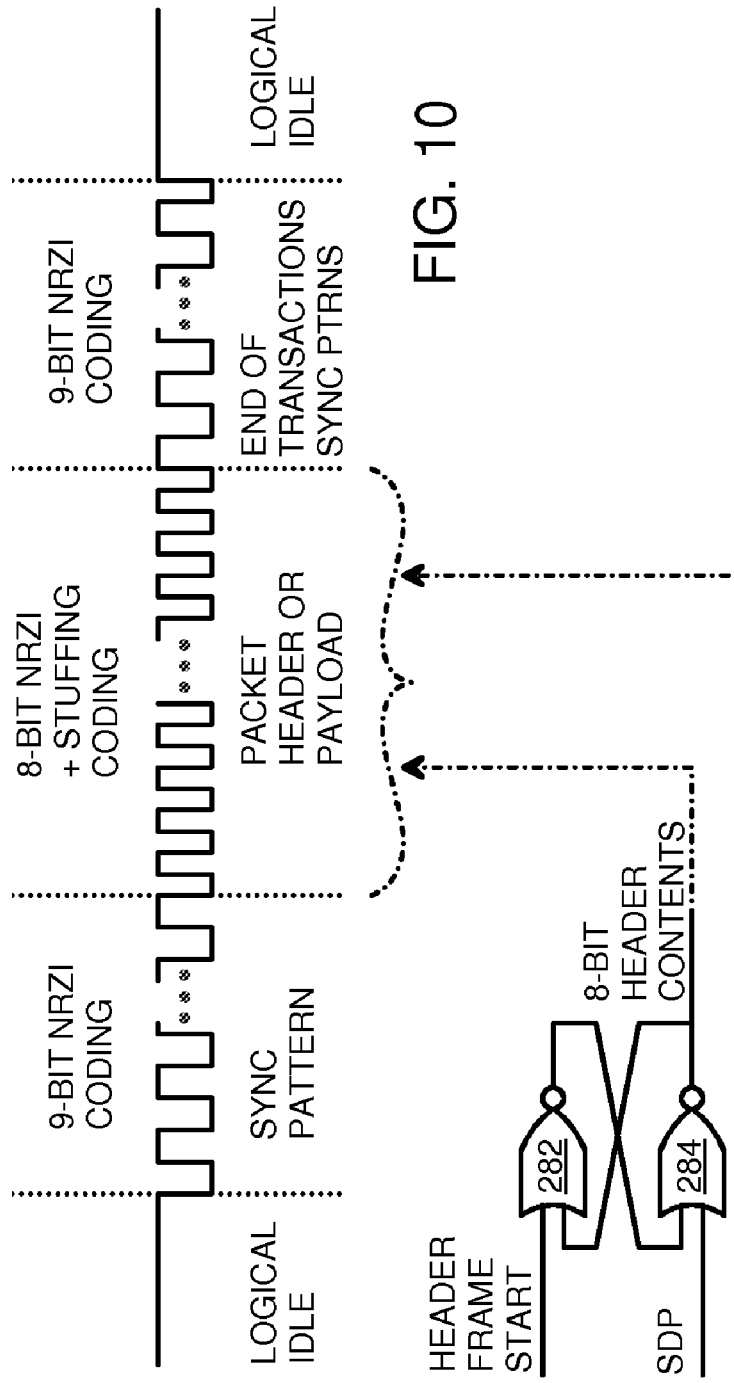
FIG. 10 is a waveform of both 8-bit data and 9-bit framing symbols in a data stream.

FIG. 10 is a waveform of both 8-bit data and 9-bit framing symbols in a data stream. The data stream is encoded as NRZI. No transitions occur when the data stream is idle. A sync pattern is first sent followed by various symbols from table 260 (FIG. 9). The data bytes in the data payload and bytes in the packet header are sent as 8-bit values that are occasionally stuffed with an extra bit to force a transition after a long sequence of 1's, as shown in FIG. 3C. The data payload or header bytes are followed by one or more 9-bit symbols and sync patterns before the data stream goes idle, or another packet or header is sent.

Thus both 8-bit data and header bytes and 9-bit framing symbols are combined in the same data stream. This low-power data stream is much more efficient that that of standard USB 3.0, which sends all data as 10-bit values since 8/10 encoding is used. Efficiency is improved by 1 bit (10%) for framing symbols, and by almost 2 bits (20%) for data bytes.

Figure 11:
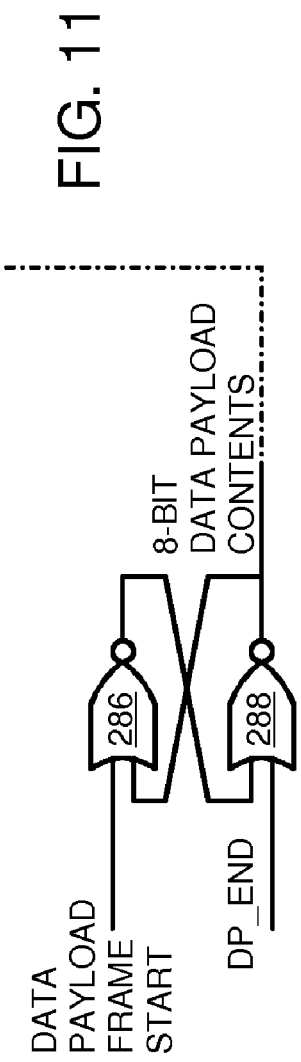
FIG. 11 shows logic for signaling header and payload starts.

FIG. 11 shows logic for signaling header and payload starts. A bistable latch is formed by OR gates 282, 284, which sets a signal indicating when the header contents are available in the data stream when the header frame start is signaled by AND gate 14 of FIG. 9. When table 260 decodes the Start Data Packet (SDP), the header timing signal is cleared.

Another bistable latch is formed by OR gates 286, 288, which sets a signal indicating when the data payload contents are available in the data stream when the data payload frame start is signaled by AND gate 10 of FIG. 9. When AND gate 16 activates DP_END, the payload timing signal is cleared. Both the data payload and the header contents are 8-bit stuffed values.

Figure 12:
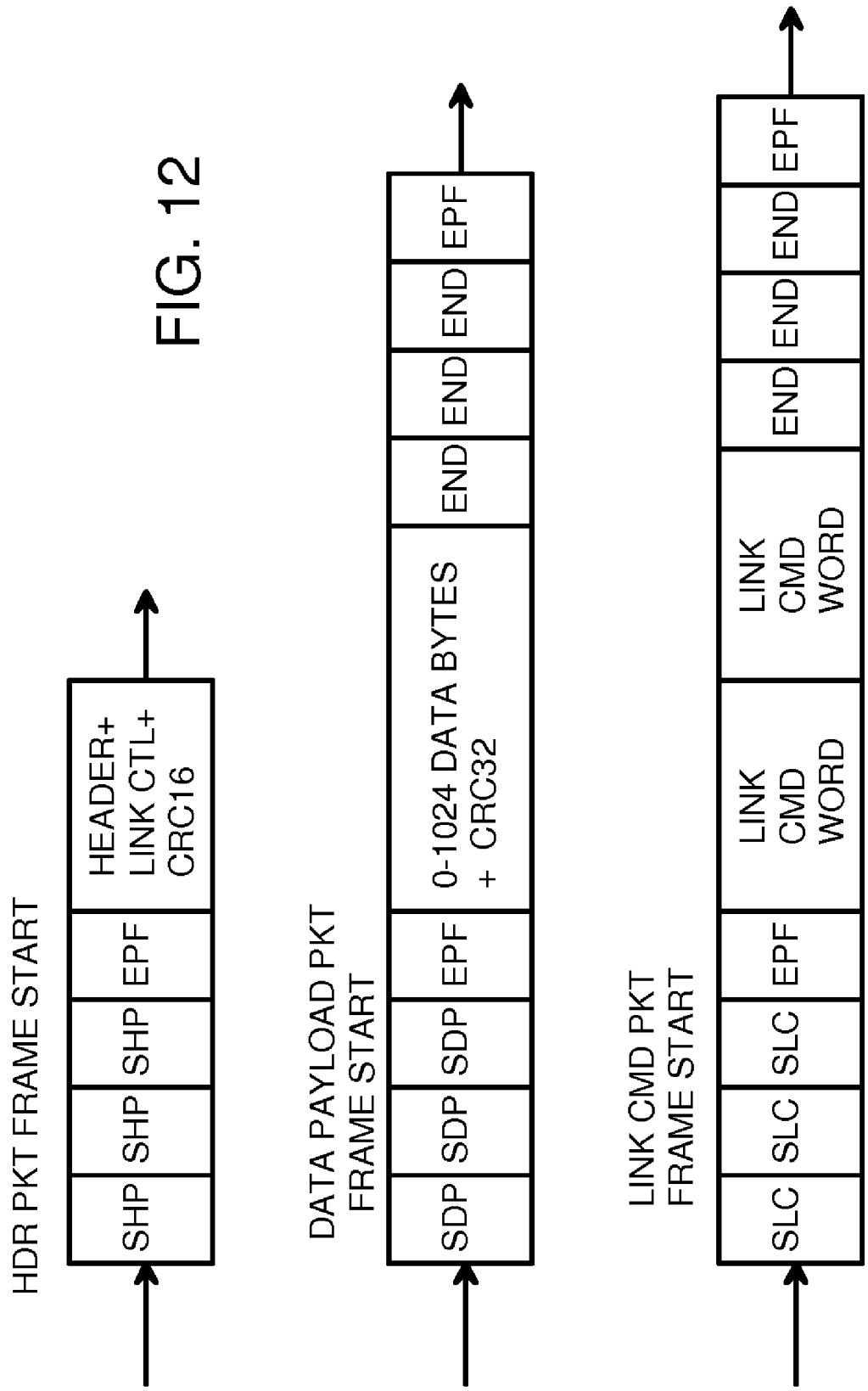
FIG. 12 shows examples of framing by the low-power physical layer.

FIG. 12 shows examples of framing by the low-power physical layer. A Data Header Packet (DHP) is indicated by three Start Header Packet (SHP) symbols being sent over three symbol clock periods. This is followed by the End Packet Framing (EPF) symbol. Then the header contents including a link control word and CRC are sent.

The header packet is followed by the payload packet. The Data Payload Packet (DPP) is indicated by three Start Data Packet (SDP) symbols being sent over three symbol clock periods. This is followed by the End Packet Framing (EPF) symbol. Then the payload contents including a CRC are sent. The payload ends with three End of packet (END) symbols and then an End of Packet Framing (EPF) symbol.

Link commands may occasionally be sent between the low-power link layers. A link command starts with three Start Link Commands (SLC) followed by an End of Packet Framing (EPF) symbol. Two identical link command words can then be sent.

Figure 13:
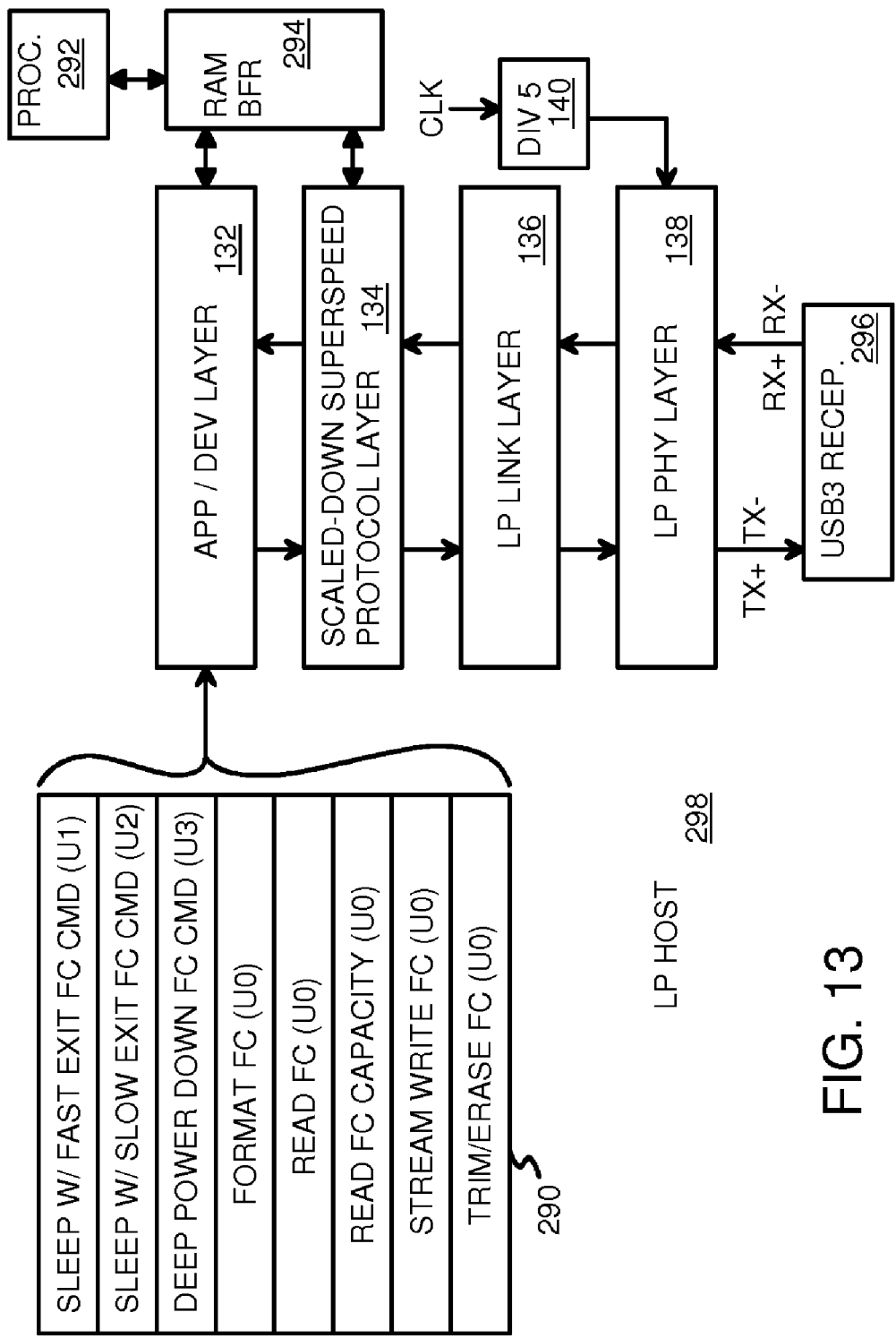
FIG. 13 shows a low-power USB host.

FIG. 13 shows a low-power USB host. Programs executing on processor 292 on low-power host 298 can send commands to application or device layer 132. Some of these low-power commands are shown in table 290. The low-power Flash Card (FC) connected to USB receptacle 296 can be commanded to enter a quick-wakeup sleep state (U1) or a slow wakeup speed state (U2) or a deep power down state (U3). Other flash commands include format, erase, read, write, and read capacity. These commands cause the flash card to wake up into the active (U0) state if the card was in one of the sleep or power down states.

Application or device layer 132 generates transaction packets from these commands in table 290, and sends data and flash commands to scaled-down protocol layer 134, which chains together packets and headers by programming pointers to packet contents in RAM buffer 294. The pointers are loaded into a DMA engine for transfer to low-power link layer 136. Low-power link layer 136 performs link power management and link training functions and generates headers. Low-power physical layer 138 performs bit stuffing on the 8-bit data and generates sync patterns (9-bit symbols) for framing, and transmits NRZI data. A four-wire interface has both a transmit and a receive differential pair, that are part of USB receptacle 296.

Clock divider 140 reduces the clock frequency by five to reduce power. At this lower frequency, special physical signal conditioning such as de-emphasis and pre-emphasis are not needed, further saving power and complexity.

Figure 14:
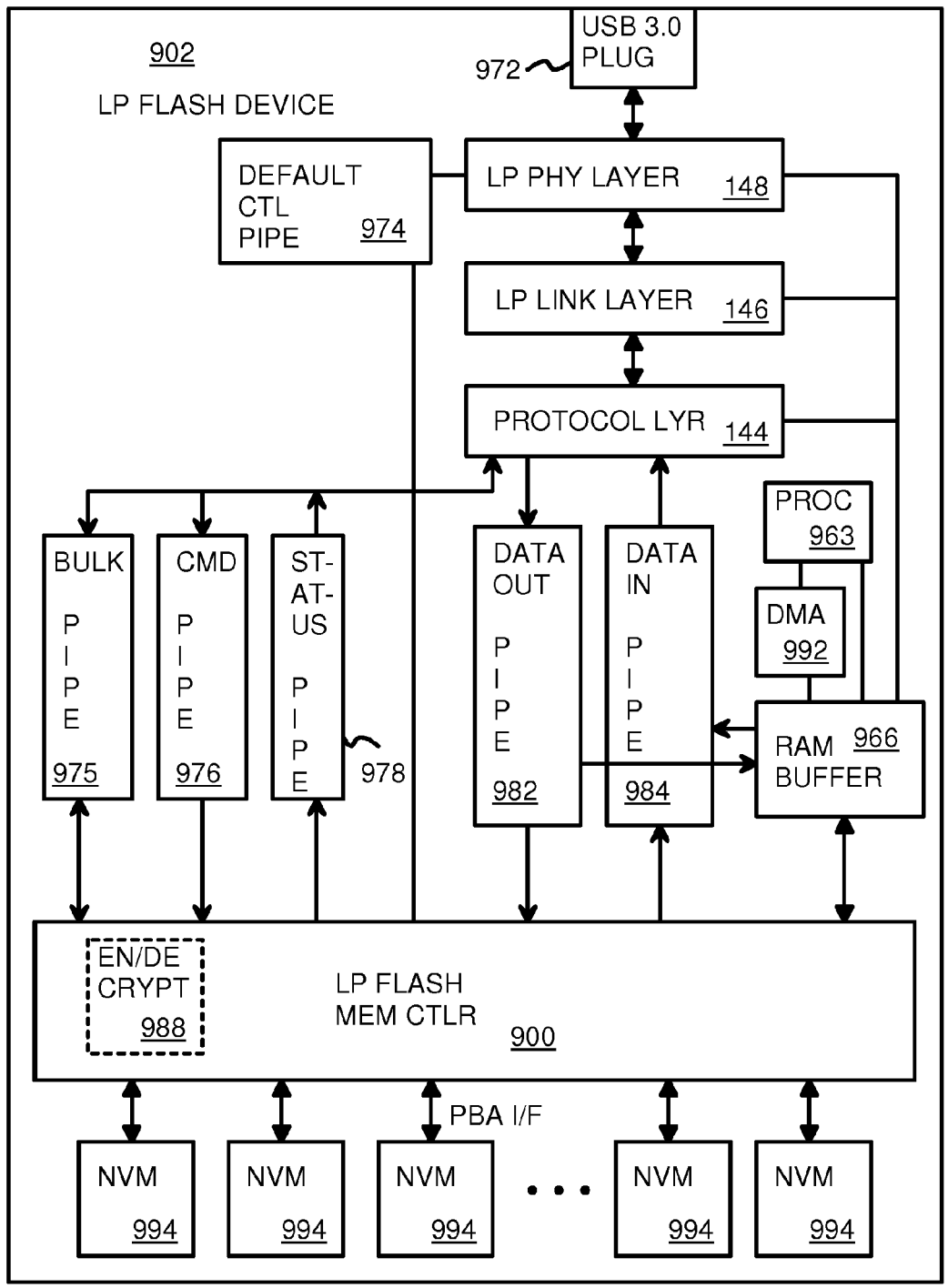
FIG. 14 is a block diagram of a low-power flash device.

FIG. 14 is a block diagram of a low-power flash device. Low-power flash device 902 has USB 3.0 plug 972 that can be plugged into USB receptacle 296 of LP host 298 (FIG. 13). Low-power flash device 902 can be an embedded device that connects directly with low-power host 298, such as with PCB traces, a connector, or a short cable.

Low-power physical layer 148 sends and receives data from USB 3.0 plug 972 having both send and receive logic shown in FIG. 4. Low-power link layer 146 responds to link training and power management from low-power link layer 136 in LP host 298. Scaled-down protocol layer 144 moves data header and payload contents to and from RAM buffer 966 by processor 963 programming pointers into DMA engine 992. Low-power link layer 146 and low-power physical layer 148 also access RAM buffer 966, such as for symbol and link control word lookups.

The data is stored in low-power flash device 902 in one or more Non-Volatile Memory (NVM) 994. Data from the low-power host are loaded into data-out pipe 982, while data read from NVM 994 are read from data-in pipe 984 and formed into packets for transmission to the host by scaled-down protocol layer 144. Commands are also loaded into data-out pipe 982 by protocol layer 964 and status read from data-in pipe 984 when the host is operating in BOT or UAS modes.

Commands from scaled-down protocol layer 144 are loaded into command pipe 976, while status is read from status pipe 978. Bulk pipe 975 is used for Bulk-Only-Transfers (BOT)) and UASP protocols for transfer efficiency.

Control information is sent through default control pipe 974. Control information is used for device enumeration during initialization and for setting device control parameters. Configurations are set using default control pipe 974 and device capability information can be obtained using default control pipe 974.

Pipes 974, 976, 978, 982, 984 can be physical registers with data that is either transferred directly with low-power flash memory controller 900, or with RAM buffer 966, which is then accessed by low-power flash memory controller 900.

Low-power flash memory controller 900 uses direct-memory access (DMA) engine 992 to transfer data to and from RAM buffer 966 and NVM 994. Low-power flash memory controller 900 includes mapping logic to re-map starting logical block addresses (LBA's) in commands to physical-block addresses (PBA's) that are sent to NVM 994. Encryptor 988 optionally encrypts data before being written to NVM 994 and decrypts data read from NVM 994.

Figure 15:
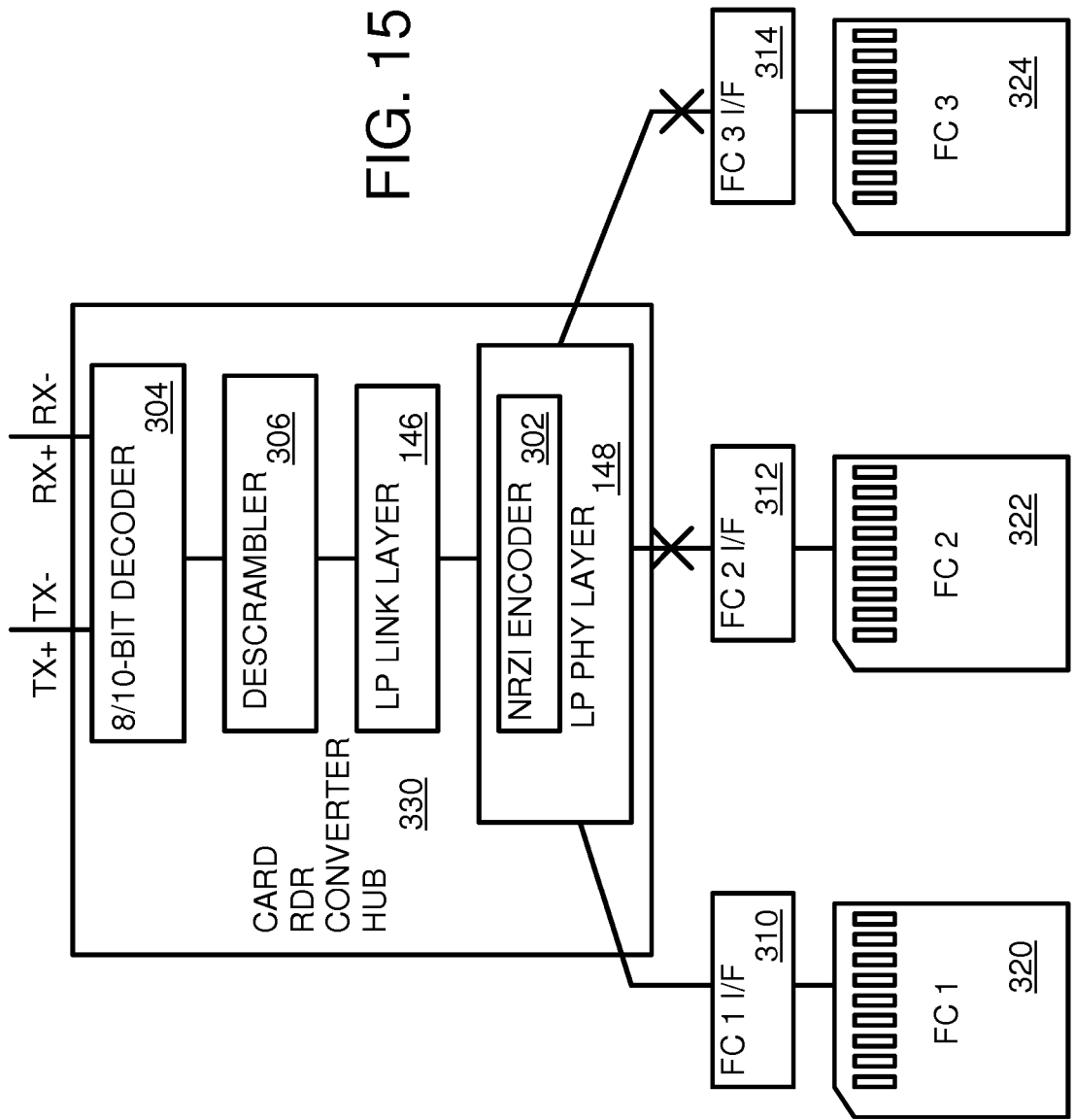
FIG. 15 shows a low-power card reader converter hub.

FIG. 15 shows a low-power card reader converter hub. Converter hub 330 can be plugged into a traditional USB 3.0 host that is not a low-power host. The transmit and receive differential pairs are received by converter hub 330 and after processing by lower layers (not shown) 8/10 bit decoder 304 converts the 10-bit NRZI data to 8-bit data. Descrambler 306 descrambles the data which is then sent back down to low-power link layer 146 and then to low-power physical layer 148. NRZI encoder 302 in low-power physical layer 148 performs bit stuffing and NRZI encoding.

Only one flash card interface is active at a time to reduce power. Data is not broadcast to all endpoints as is traditionally done in USB 3.0. Thus flash interfaces 312, 314 are disabled when flash interface 310 is activated to access flash card 320. Flash cards 320, 322, 324 are removable flash cards, such as SD cards, CF cards, and others.

Figure 16:
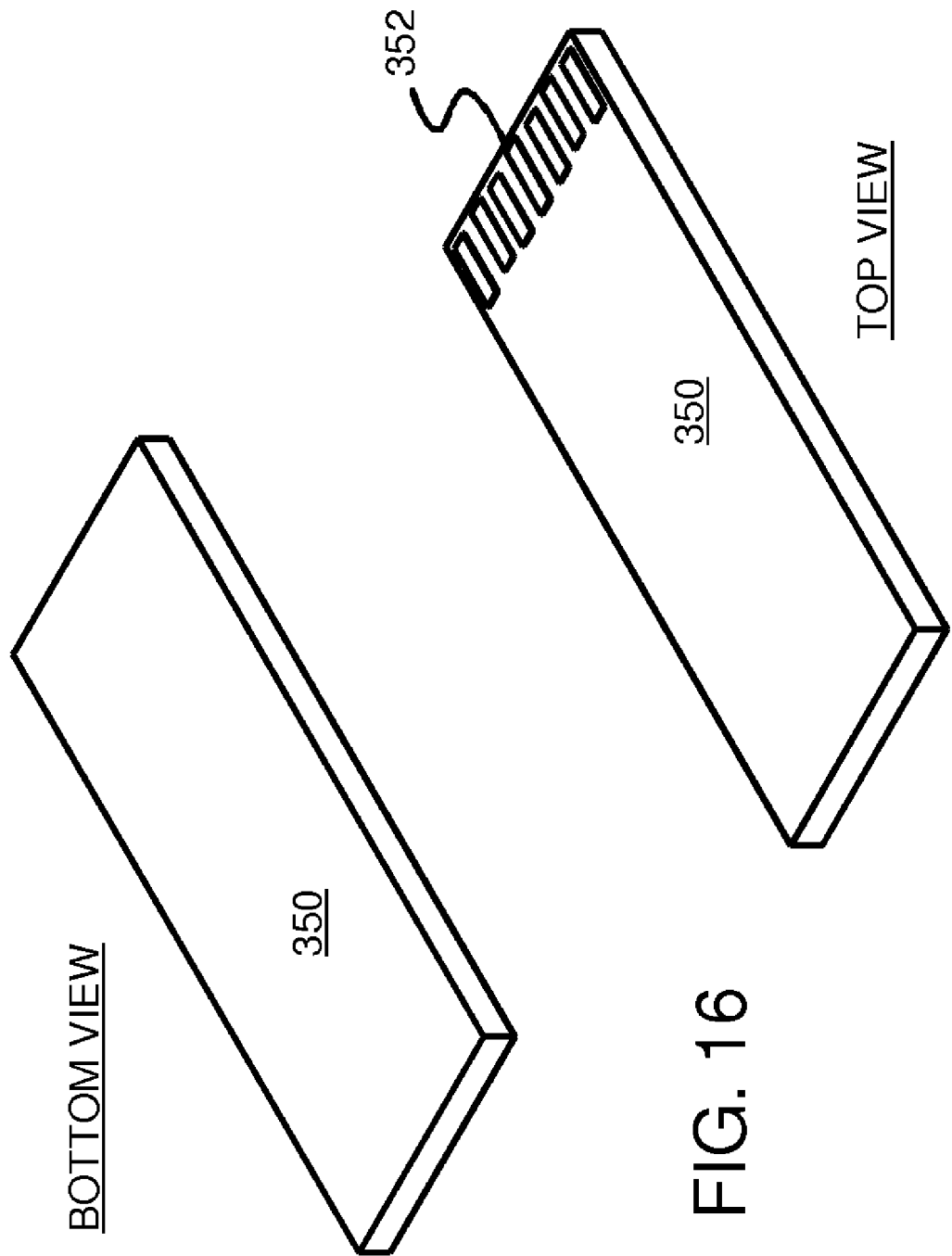
FIG. 16 shows a low-power USB flash device.

FIG. 16 shows a low-power USB flash device. Low power flash device 350 can be a flash card with a USB 3.0 form factor on one end with the circuitry of FIGS. 4-6, such as low-power flash device 902 of FIG. 14 or low-power flash device 128 of FIG. 1. Metal pads 352 include transmit and receive differential pairs and can carry low-power USB signals. Metal pads 352 can fit into a standard USB socket.

Figure 17:
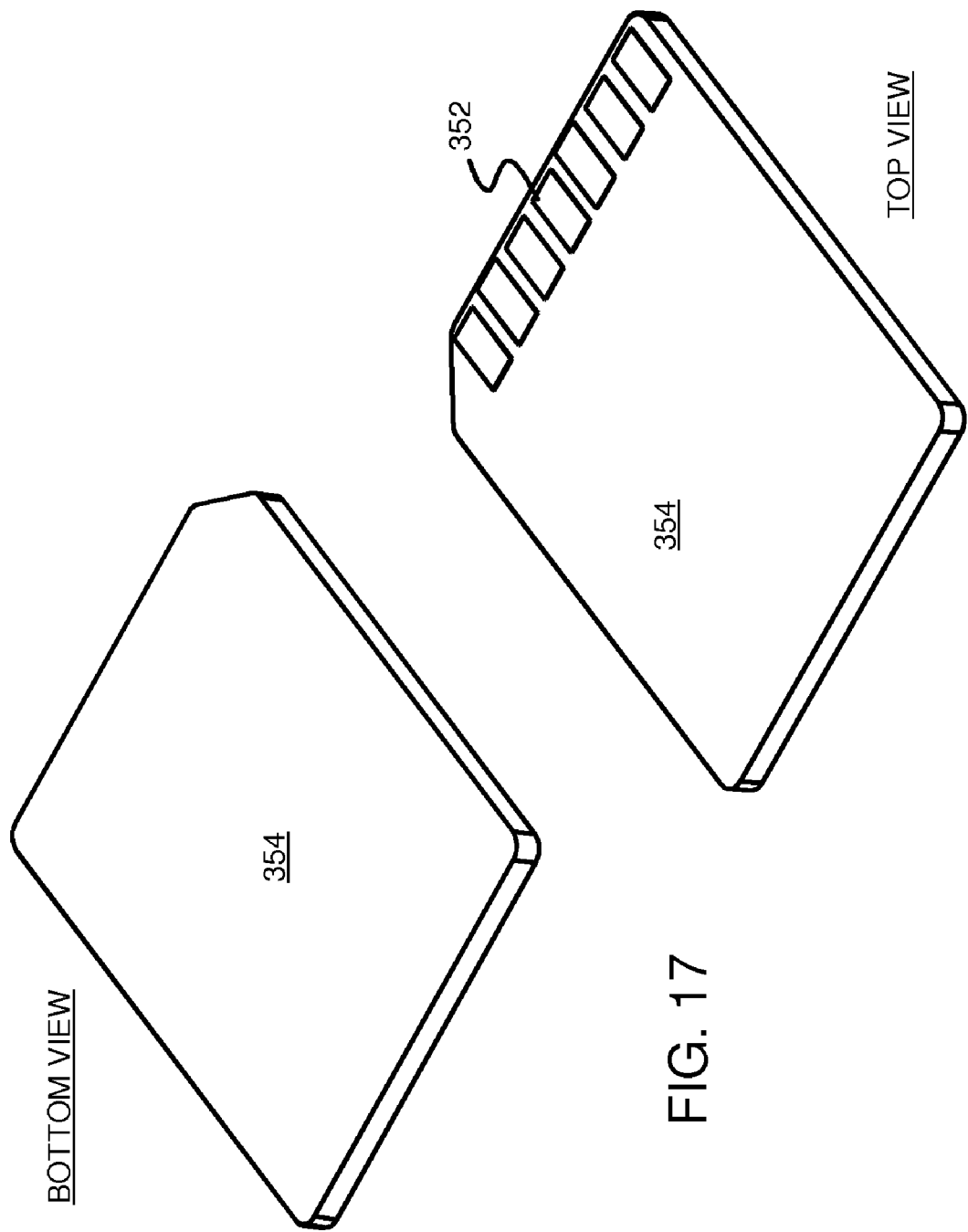
FIG. 17 shows a SD-card low-power flash device.

FIG. 17 shows a SD-card low-power flash device. Low power flash device 354 can be a Secure Digital (SD) flash card in a SD form factor with the circuitry of FIGS. 4-6, such as low-power flash device 902 of FIG. 14 or low-power flash device 128 of FIG. 1. Metal pads 352 include transmit and receive differential pairs and can carry low-power USB signals, although metal pads 352 do not fit into a standard USB socket, but fit into a SD socket.

Figure 18:
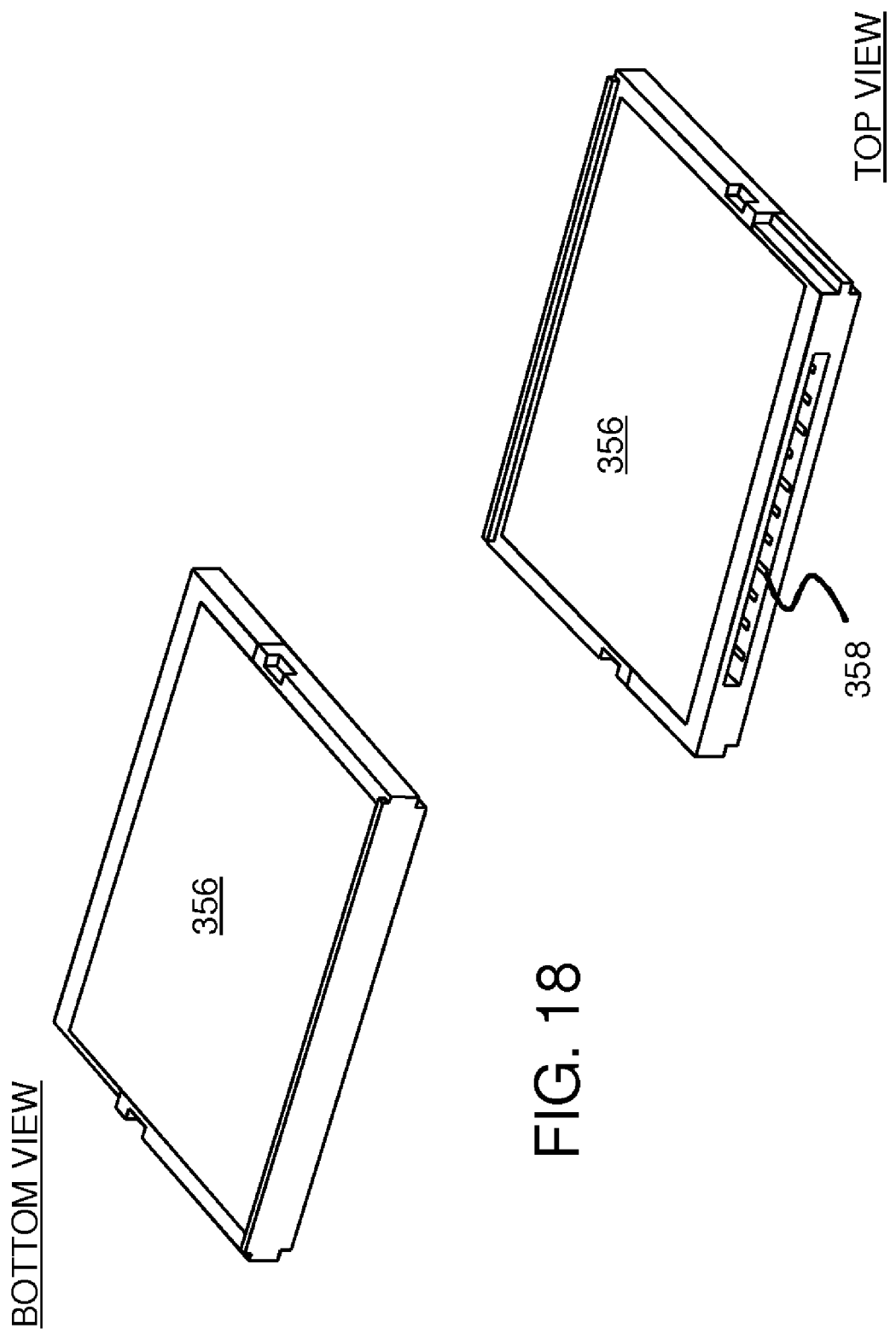
FIG. 18 shows a Compact-Flash low-power flash device.

FIG. 18 shows a Compact-Flash low-power flash device. Low power flash device 356 can be a Compact-Flash (CF) flash card in a CF form factor with the circuitry of FIGS. 4-6, such as low-power flash device 902 of FIG. 14 or low-power flash device 128 of FIG. 1. Metal pads 358 include transmit and receive differential pairs and can carry low-power USB signals, although metal pads 358 do not fit into a standard USB socket, but fit into an 11-pin CF socket.

Figure 19:
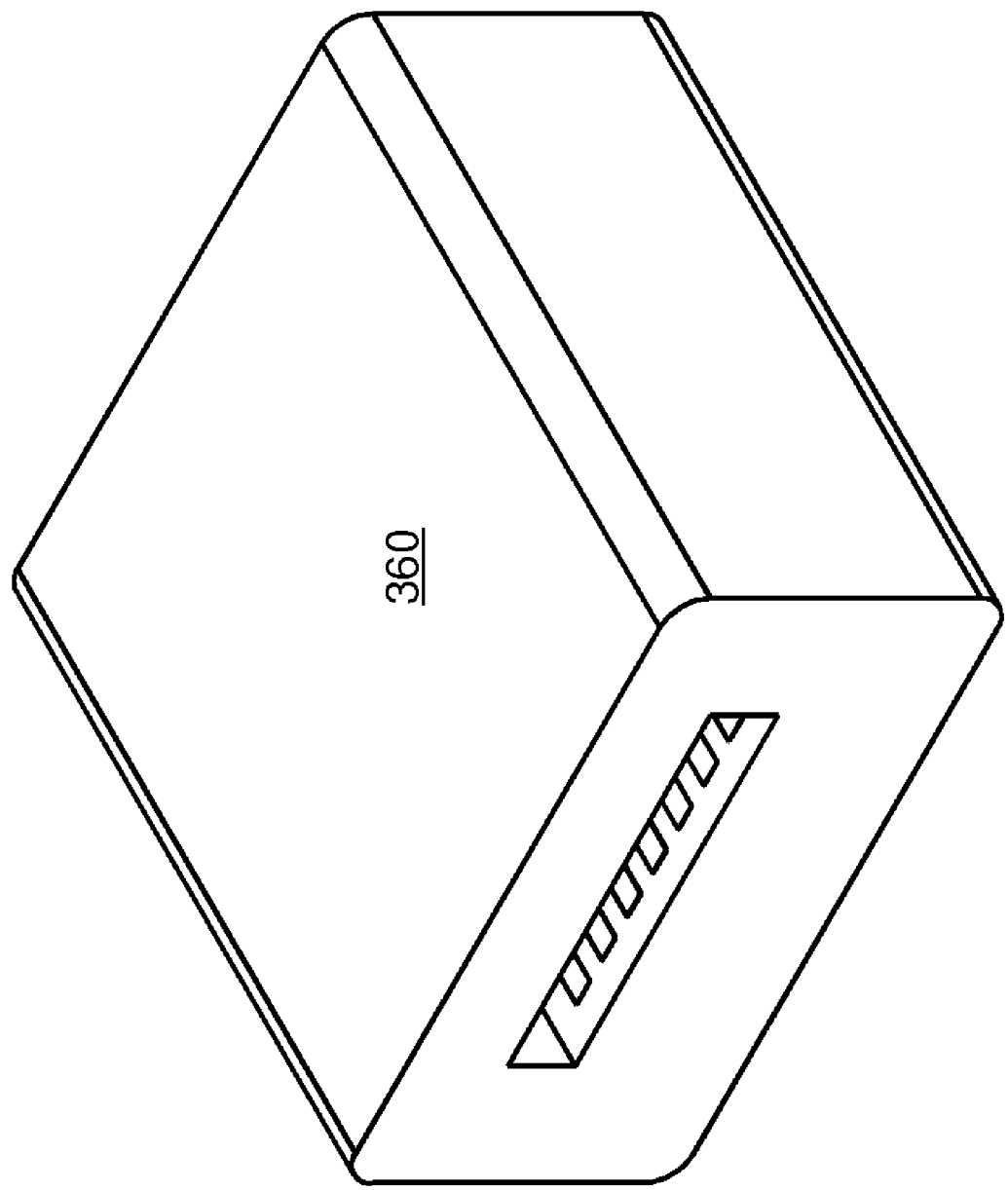
FIG. 19 shows a USB socket.

FIG. 19 shows a USB socket. USB socket 360 can be on a host PC and can accept low power flash device 350 of FIG. 16. A 7-pin interface includes both transmit and receive pairs, plus power and ground.

Figure 20:
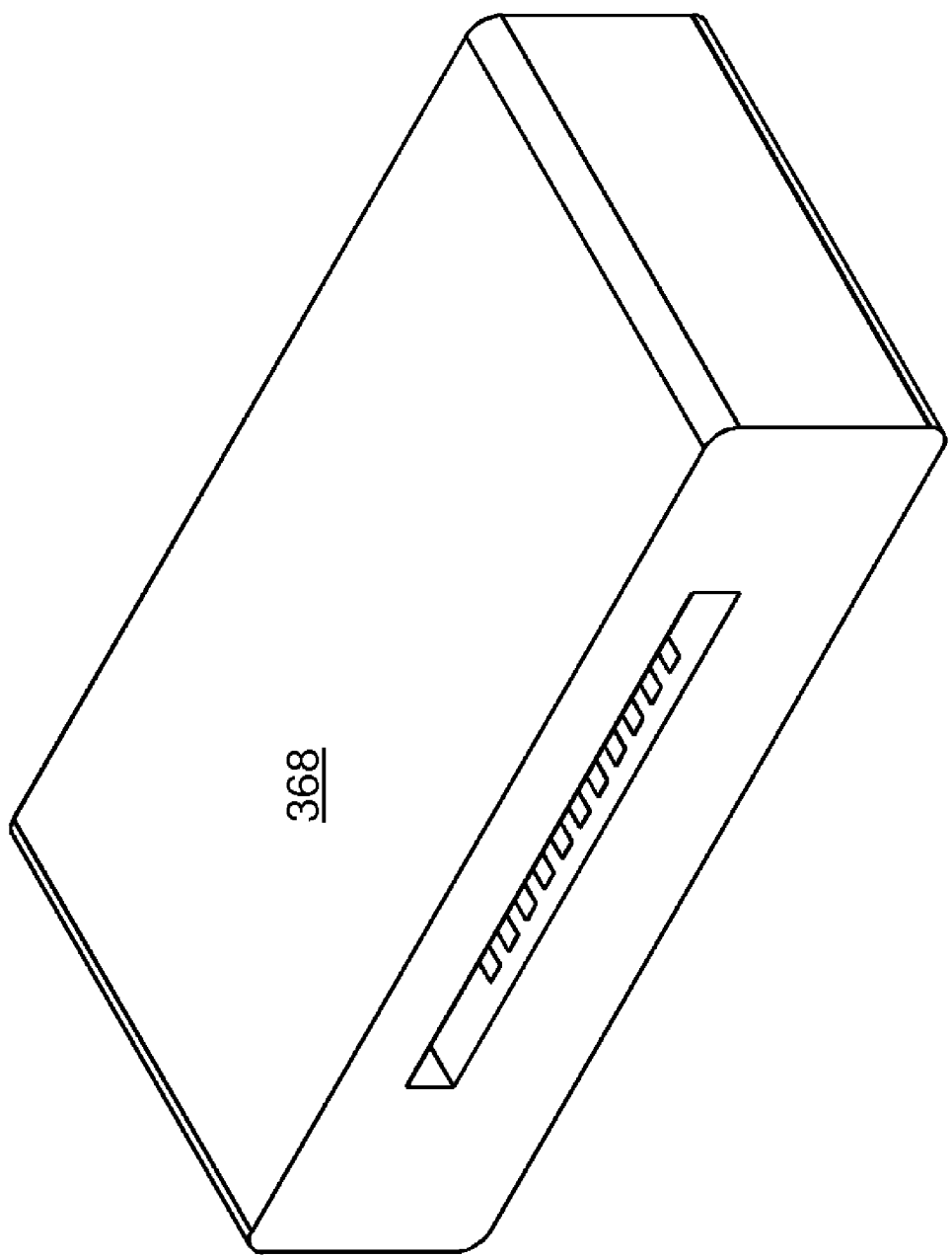
FIG. 20 shows a CF socket.

FIG. 20 shows a CF socket. CF socket 368 can be on a host PC and can accept low power flash device 356 of FIG. 18, which has the CF form factor. An 11-pin interface includes both transmit and receive pairs, plus power and ground.

Figure 21:
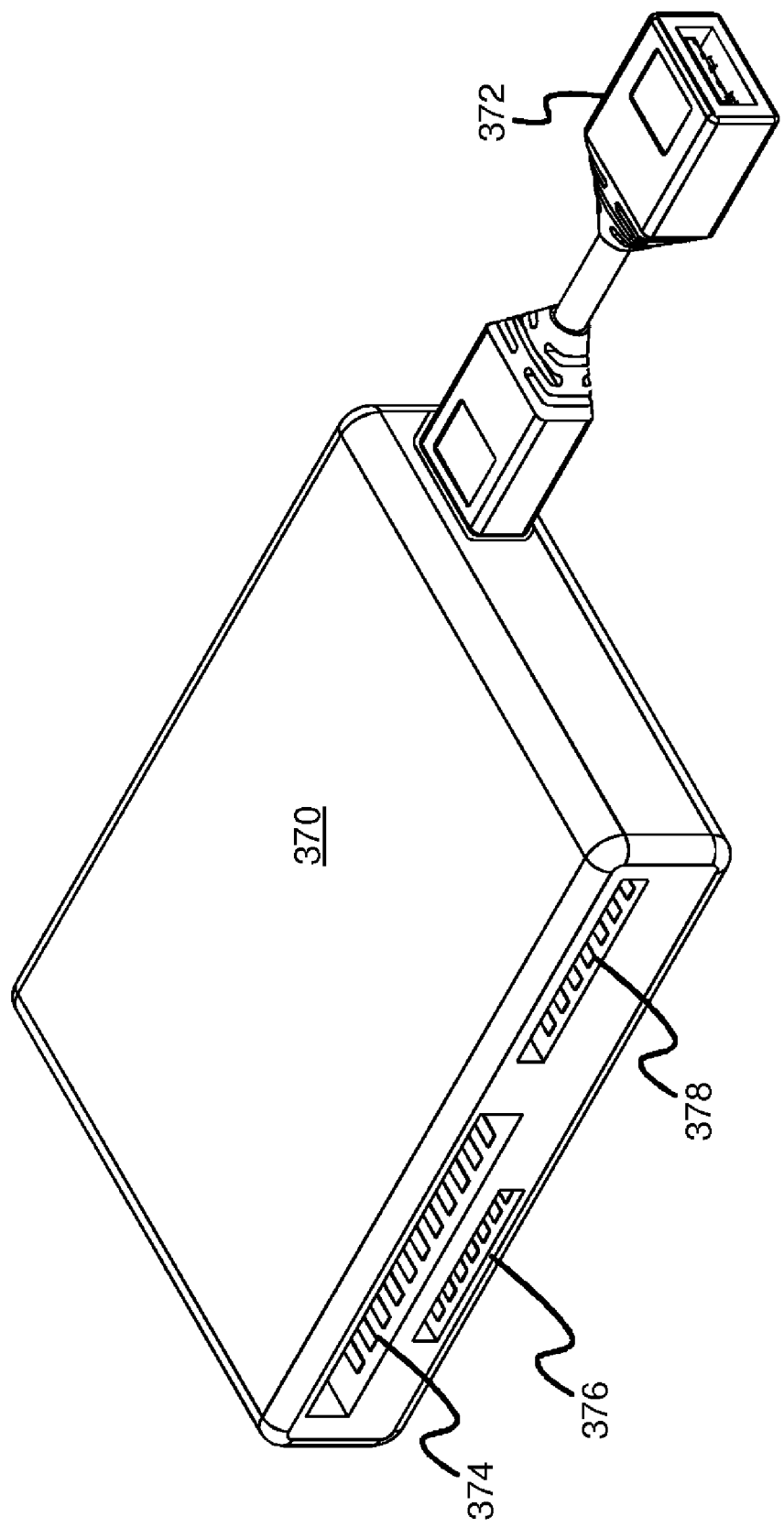
FIG. 21 shows a converter hub.

FIG. 21 shows a converter hub. Converter hub 370 can be converter hub 330 of FIG. 15, with slots 374, 376, 378 to receive flash cards of various formats, such as CF and SD. USB connector 372 fits into a USB socket on the host.

Figure 22:
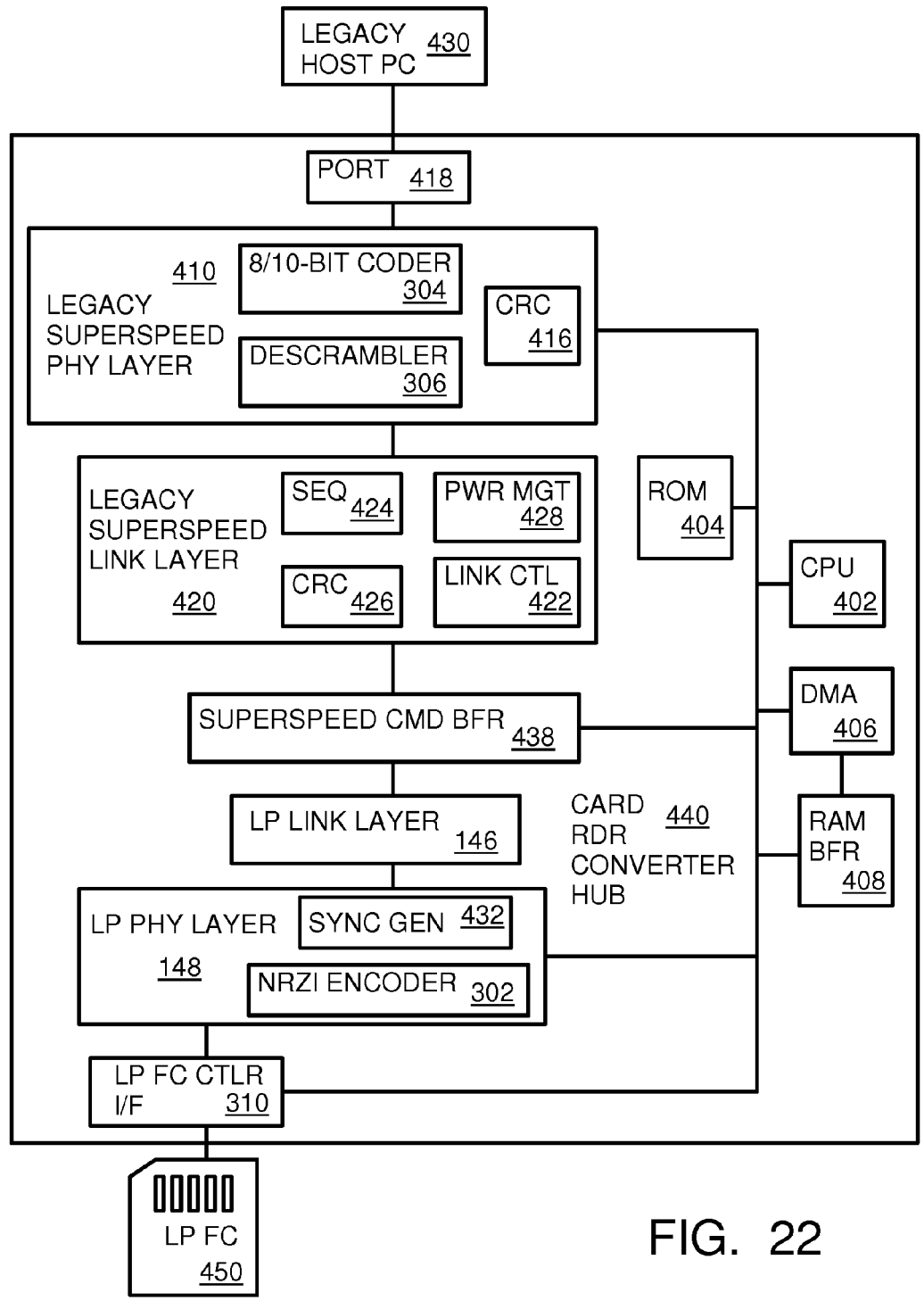
FIG. 22 shows a card reader converter hub in detail.

FIG. 22 shows a card reader converter hub in detail. Card reader converter hub 440 connects to host 430 that does not support low-power USB. Port 418 can be a standard USB 3.0 connector, and connects a transmit and a receive differential pair to physical layer 410. Physical layer 410 includes 8/10 bit encoder/decoder 304, CRC checker 416, and descrambler 306 that are not present in low-power physical layer 148.

Link layer 420 includes sequence number generator/checker 424, CRC checker/generator 426, power management 428 and link control 422. Commands are then stored in command buffers 438.

Low-power link layer 146 receives these commands from command buffers 438 and sends link packets to low-power physical layer 148, which includes sync generator/detector 432 and NRZI encoder/decoder 302. The NRZI data stream is sent to flash-card controller interface 310 for communication with low-power flash card 450, which can be similar to low-power flash device 902 of FIG. 14 or low-power flash device 128 of FIG. 1.

Central Processing Unit (CPU) 402 executes instructions from read-only memory (ROM) 404 and programs pointers into DMA engine 406, which moves data to and from RAM buffer 408 and between physical layer 410, link layer 420, command buffers 438, Low-power link layer 146, low-power physical layer 148, and flash-card controller interface 310.

The LP Flash Card (FC) may also include feasible advanced features such as double data rate transfer for data transfer at each edge of clocking, a low operating voltage, a higher operating frequency, Insertion/Removal automatic detection, better error correction for flash memory data contents, etc.

The sequence for reading data and writing data of this low power FC is as follows. The low-power flash card controller (box 128 in FIG. 1B or box 450 in FIG. 22) of this flash card assigns a designated register as an ID command register that allows the flash card to be identified. The known low-power flash card will be dedicated for LP operations.

For a LP flash card running after a low power command, a lower data clock is selected and issued to the device through the host USB port when the low-power flash card is acknowledged as a dedicated low-power device.

In order to consume less power, this low power scheme also includes the use of a lower operating voltage such as 1.8V (or 1.2V), a double data rate transfer to facilitate higher data transfer rate. A NRZI and bit stuffing encoding system utilized in the host or card reader consumes much less power than the host or CR using 8/10 bit encoding scheme. A designated register turns on the power saving mode, such as a sleep mode and a standby mode, that are defined by the low-power flash card controller of a flash card. These low-power modes defined by the low-power FC may not be accompanied with the traditional USB low-power spec.

For a host with LP function, an initial command to interrogate the LP device is sent repeatedly until being realized and responded by the device.

Alternate Embodiments

Several other embodiments are contemplated by the inventors. For example, while a clock divisor of 5 has been described, other clock divisors could be used for various amounts of power savings.

Various bus topologies and arrangements of NVM, flash memory, controllers, etc. are possible. USB 3.0 may be modified, or other versions of USB may be modified. A variety of bus timings and sequences may be supported. Not all pipes may be present, depending on the transfer modes supported.

The host may enter a suspend or sleep mode when the not ready (NRDY) signal is received. Instead of USB or other differential buses mentioned above, SD, MicroSD, MMC, or microMMC interfaces can also be applied in this invention. Rather than use SD buses, other buses may be used such as Memory Stick (MS), Compact Flash (CF), IDE bus, etc. Additional pins can be added or substituted. A multi-bus-protocol chip could have an additional personality pin to select which bus interface to use, or could have programmable registers.

For FIG. 1B, the device package for low-power flash device 128 can be a COB (Chip-on-board), PCBA (PCB Assembly), or the device itself can be inside another mechanical package such as a COB uSD inside a regular SD card package.

Non-volatile memory (NVM) such as flash memory 118 in FIG. 1A or 1B, or NVM 994 in FIG. 14 may use interface signals such as traditional 8 or 16 bit single data rate (SDR) parallel input-output plus command strobes such as Read/Write, chip select, clock input, etc. The interface can also be high speed double data rate (DDR) serialized data streamed IO, with the help of synchronous DDR interface and Data Query Strobe (DQS). The free running clock which traditional NVM needs can be eliminated to further save power and effectively increase NVM operating speed. The interface can be either Toggle NAND or ONFI standard flash memory.

The topology for pins of the LP FC such as box 320, 322, 324 in FIG. 15 can be a single row as shown or can be multi-row to accommodate more signal inputs and outputs.

Various page sizes may be used, such as 1K, 2K, 4K, 8K, etc. Flash blocks may have 4 pages, 8 pages, 64 pages, or some other number, depending on the physical flash chips and arrangement used.

While the invention has been described using an USB controller, a SD, MMC, PCIE, or other controller may be substituted. A combined controller that can function for multiple interfaces may also be substituted.

Mode logic could sense the state of a pin only at power-on rather than sense the state of a dedicated pin. A certain combination or sequence of states of pins could be used to initiate a mode change, or an internal register such as a configuration register could set the mode.

The processor, components such as the protocol layers, bus interfaces, DMA, flash-memory controller, transaction manager, and other controllers and functions can be implemented in a variety of ways. Functions can be programmed and executed by the CPU or other processor, or can be implemented in dedicated hardware, firmware, or in some combination. Many partitioning of the functions can be substituted.

Data and commands may be routed in a variety of ways, such as through data-port registers, FIFO or other buffers, the CPU's registers and buffers, DMA registers and buffers, and flash registers and buffers. Some buffers may be bypassed or eliminated while others are used or present. Virtual or logical buffers rather than physical ones may also be used. Data may be formatted in a wide variety of ways.

Other transaction types or variations of these types can be defined for special purposes. These transactions may include a flash-controller-request, a flash-controller-reply, a boot-loader-request, a boot-loader-reply, a control-program-request, a control-program-reply, a flash-memory-request, and a flash-memory-reply. The flash-memory request/reply may further include the following request/reply pairs: flash ID, read, write, erase, copy-back, reset, page-write, cache-write and read-status.

The host may be a personal computer (PC), a portable computing device, a digital camera, a phone, a personal digital assistant (PDA), or other electronic device. The partition of RAM among various functions could change over time.

Wider or narrower data buses and flash-memory blocks could be substituted, such as 4, 5, 8, 16, 32, 64, 128, 256-bit, or some other width data channels. Alternate bus architectures with nested or segmented buses could be used internal or external to the microcontroller. Two or more internal and flash buses can be used in the USB flash microcontroller to increase throughput. More complex switch fabrics can be substituted for the internal buses. Redundant Array of Individual Disks (RAID) can be supported by redundant storage in channels or flash devices. Combining 1 KB USB packets into 8 KB payloads could be performed by the RAM buffer or DMA, and other payload and packet sizes could be substituted. Some packets may me smaller than the maximum size, and there may be empty space in payloads, or payloads may have a variable size.

The physical layer can receive physical signals with a predetermined pin assignment. The predetermined pin assignment may be based on a pin count of the flash-memory card. The pin assignment may include one set of two pairs of differential serial buses: (i) a first pair differential serial bus with a first pin carry+signal and a second pin carry−signal, and (ii) a second pair differential serial bus with a first pin carry+signal and a second pin carry−signal. In an alternative design, extra pairs of differential serial bus can increase performance by adding pairs of such high speed serial differential signal lines.

The flash mass storage chips or blocks or Non-Volatile Memory Devices (NVMDs) can be constructed from any flash technology including multi-level-logic (MLC) memory cells and single level cells (SLC). Phase change memory may be used as flash memory. Data striping could be used with the flash mass storage blocks in a variety of ways, as can parity and error-correction code (ECC). Data re-ordering can be adjusted depending on the data arrangement used to prevent re-ordering for overlapping memory locations. A hub or switch such as port multiplier could be integrated with other components such as a Smart Storage Switch. While a single-chip device has been described, separate packaged chips or die may be stacked together while sharing I/O pins, or modules may be used.

A microcontroller can generate a not-yet signal that is transmitted to the host over the transmit pair when the RAM buffer does not yet contain requested data that is waiting to be read from the flash memory. The not-yet signal is transmitted over the transmit pair when the requested data is waiting to be read from the flash memory.

The busy LP USB device sends a not-yet NYET signal back to the LP USB host to instruct the host to continue with other tasks without waiting. When the LP USB device is ready to continue transfer with the host, the LP USB device wakes up the host by sending a ready RDY signal back to the host for resuming the previous transfer. This improvement can dramatically save host power without waiting and continuing polling the device status. Also if several LP devices are connected with host, only one addressed LP device will be accessing the host, the others non-related devices will not be disturbed for power-saving purposes. This non-broadcast feature for host communication with devices is another way to reduce power of LP USB systems.

Furthermore, the LP USB device transfers internal data using a chained Direct-Memory Access (DMA) as in FIG. 6 DMA 234. Registers in a DMA controller point to a vector table that has vector entries; each pointing to a destination and a source. The source is a memory table for a memory group. The memory table has entries for several memory segments. Each memory-table entry has a pointer to a memory segment and a byte count for the segment. Once all bytes in the segment are transferred, a flag in the entry indicates when another memory segment follows within the memory group.

Figure 23:
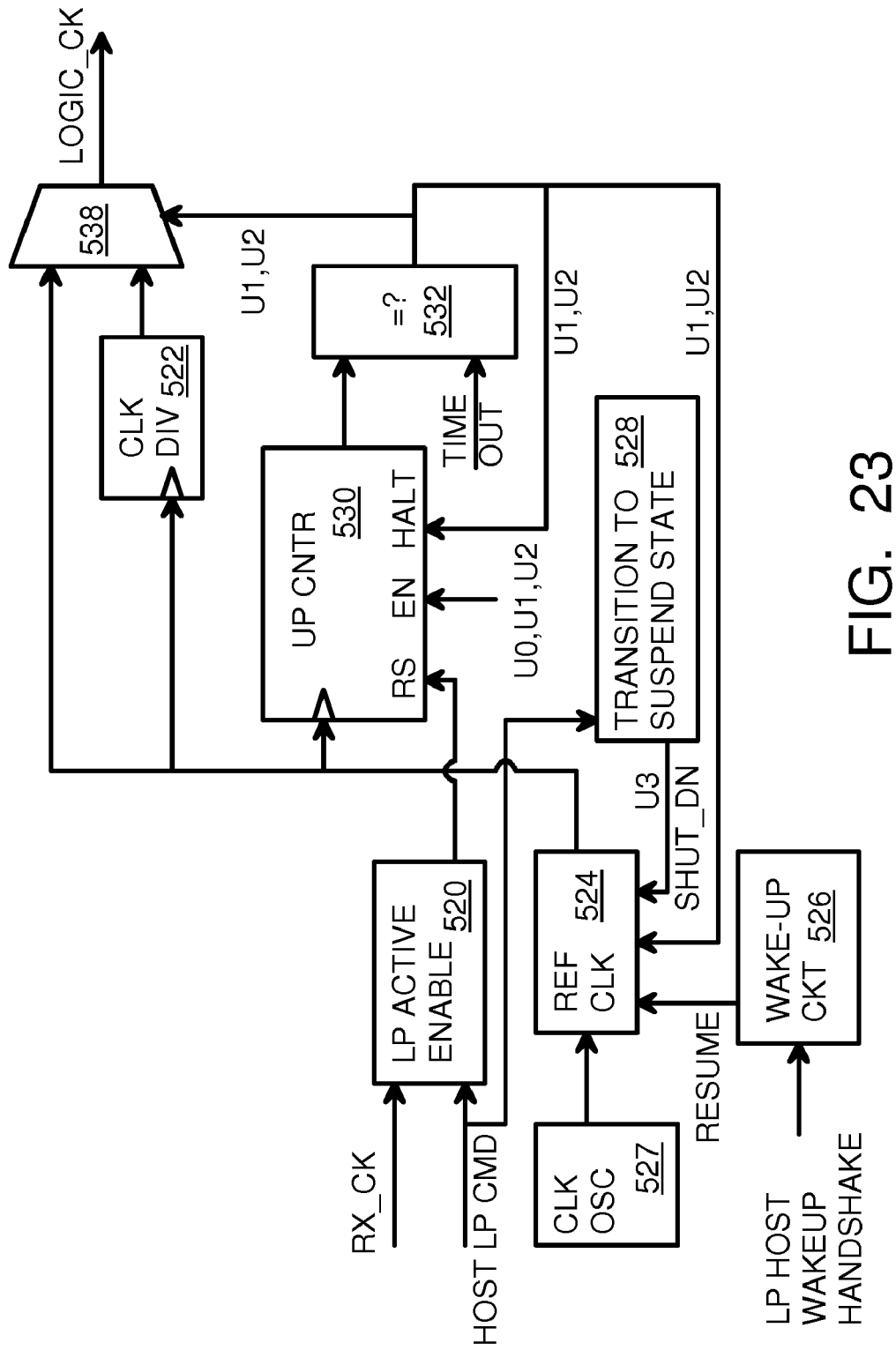
FIG. 23 shows a clock module.

FIG. 23 shows a clock module. The flash card device may include a power-saving state machine to control the clock oscillator that generates different clock rates used by the system. The power-saving state machine includes active enable circuit 520 responsive to a host clock data rate recovered by receive clock RX_CK and a host LP command. Active enable circuit 520 detects the absence of a host command for a predetermined period of time and when the predetermined period of time exceeds a threshold value, power saving arbitrator mux 538 selects the lower clock rate output from clock divider 522 to the system to reduce power consumption of the system.

Wake-up circuit 526 is activated by a wake-up handshake with the host, and resumes reference clock logic 524. The clock from oscillator 527 is passed through reference clock logic 524 and the reference clock is applied to clock divider 522, power saving arbitrator 538, and up counter 530. Once up counter 530 reaches a preset timeout value applied to comparator 532, the slower clock from clock divider 522 is chosen by mux 538 rather than the full-speed clock. If the state is U3, the suspend state, the reference clock is stopped. When the reference clock is stopped, the host can issue a wake up command, such as when a user moves the mouse or touches a key on the keyboard, causing state transition logic 528 to be activated and restart the reference clock.

The preset timeout value can vary for different states, such as 2 ms for states U1, U2, an 10 ms for state U3.

Up counter 530 is initiated when LP active commands from host are issued. Up counter 530 is enabled during low power or normal states (U0, U1, U2). When the timeout value is reached, up counter 530 is stopped while waiting for next host command.

The host can also command a transition to the power-down state using a command that activates state transition logic 528. Up counter 530 is reset when commands are received from the host. PLL 185 of FIG. 4 could be extended to include this power-saving logic. The device can save more power when activities are idle, and then by entering to the low power mode state after a predetermined time elapses and then back to the normal state when activities are detected. The total power consumption of the device may be lowered by introducing data encoding schemes and other features for future mobile applications, such as film storage in cell phones.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A low-power Universal-Serial-Bus (USB) device comprising:
   a transmit pair for sending data to a host;
   a receive pair for receiving data from the host;
   a low-power physical layer that comprises:
      a set of two pairs of differential serial buses, a first pair bus with a first pin carry+signal and a second pin carry−signal, and a second pair differential serial bus with a first pin carry+signal and a second pin carry−signal, wherein the set of two pairs of differential serial buses comprises the receive pair and the transmit pair;
      a driver for driving the transmit pair with a transmit data stream;
      a bit clock for clocking bits of the transmit data stream;
      a parallel-to-serial converter, clocked by the bit clock, for converting data bytes for transmission to serial data for transmission by the driver;
      a receiver for detecting signal transitions on the receive pair;
      a receive clock recovery circuit, coupled to the receiver, for generating a received bit clock from the signal transitions detected by the receiver;
      a sync pattern detector for detecting sync patterns received by the receiver;
      a serial-to-parallel converter, clocked by the received bit clock, for converting the extracted data stream to received data bytes;
      an elastic buffer for storing the received data bytes;
   a low-power link layer, coupled to the low-power physical layer, for generating and processing link control words for controlling link power and for link training; and
   a scaled-down protocol layer for pointing to headers and payloads in a memory buffer for transfer to the low-power link layer;
   a flash memory for storing data in non-volatile memory; and
   a RAM buffer coupled to the scaled-down protocol layer, for storing output parallel words read from the flash memory by a flash interface, and for storing input parallel words before writing to the flash memory by the flash interface; and
   a microcontroller coupled to receive addresses, commands, and data from the scaled-down protocol layer, for generating flash commands for accessing the flash memory, the microcontroller generating a not-yet signal that is transmitted to the host over the transmit pair when the RAM buffer does not yet contain requested data that is waiting to be read from the flash memory,
   whereby the not-yet signal is transmitted over the transmit pair when the requested data is waiting to be read from the flash memory.

2. The low-power USB device of claim 1 wherein the low-power physical layer further comprises:
   a sync pattern generator, in the low-power physical layer, for generating 9-bit symbols representing framing patterns;
   a bit stuffer for inserting a stuffed bit causing a signal transition on the transmit pair, the bit stuffer inserting the stuffed bit into a data stream after a predetermined number of bits that do not cause the signal transition to occur in a sequence;
   a NRZI encoder, receiving the data stream and the stuffed bit from the bit stuffer, and receiving the 9-bit symbols from the sync pattern generator, for generating transmit data applied to the driver in a Not-Return-to-Zero-Inverse (NRZI) format;
   a NRZI decoder for generating a received data stream from the signal transitions detected by the receiver; and
   a stuffing remover for removing stuffed bits from the received data stream to generate an extracted data stream.

3. The low-power USB device of claim 2 wherein the low-power physical layer further comprises:
   a clock divider, receiving a core clock, for reducing a frequency of the core clock to generate the bit clock, wherein the bit clock operates at a lower frequency than a bit clock for a standard USB protocol.

4. The low-power USB device of claim 3 wherein the low-power USB device is
   embedded on a same printed-circuit board (PCB) as the host, wherein the low-power USB device is an embedded device.

5. The low-power USB device of claim 3 further comprising:
   a data-out pipe, coupled to receive data packets from the scaled-down protocol layer, for storing data packets received from the host over the receive pair;
   a data-in pipe, coupled to send data packets to the scaled-down protocol layer, for storing data packets for transmission to the host over the transmit pair.

6. The low-power USB device of claim 5 further comprising:
   a command pipe, coupled to receive commands from the scaled-down protocol layer, for storing commands received from the host over the receive pair;
   a status pipe, coupled to send status messages commands to the scaled-down protocol layer, for storing status messages for transmission to the host over the transmit pair.

7. The low-power USB device of claim 5 further comprising:
   a chaining direct-memory access (DMA) engine, programmed by the scaled-down protocol layer to transfer headers and payloads between the low-power link layer and the memory buffer.

8. The low-power USB device of claim 5 wherein the predetermined number of bits that do not cause the signal transition comprises six bits each having a value of logical one.

9. The low-power USB device of claim 3 further comprising:
 a low-frequency periodic signal generator, receiving the bit clock, for generating a low-frequency periodic signal;
 a mux, receiving the low-frequency periodic signal and receiving the transmit data from the NRZI encoder, for applying the low-frequency periodic signal to the driver when a power-down mode is enabled, and for applying the transmit data to the driver when the power-down mode is not enabled.

10. The low-power USB device of claim 9 wherein the flash memory comprises a plurality of Non-Volatile Memory (NVM) and wherein an interface of the plurality of NVM is a serialized double data rate data input and output, which utilizes a data strobe signal to qualify the data access, without a clock input to the plurality of NVM.

11. The low-power USB device of claim 9 further comprising:
 an encryptor/decryptor, coupled to a flash memory controller, for encrypting data in payloads before writing the payloads to the flash memory, and for decrypting payloads read from the flash memory before transfer to the memory buffer.

12. A Universal-Serial-Bus (USB) low-power host comprising:
 a host processor for executing instructions;
 a main memory for storing data;
 an Input-Output processor, coupled to the host processor, for accessing peripherals on a peripheral bus;
 a host low-power USB port connected to a first pair and to a second pair of lines;
 a host simplified low-power USB controller for accessing a low-power USB device; wherein the host simplified low-power USB controller comprises:
  a host low-power physical layer coupled to the host low-power USB port;
  a host low-power link layer coupled to the host low-power physical layer;
  a host scaled-down protocol layer coupled to the host low-power link layer;
  wherein the USB low-power host suspends sending serial packets to a low-power USB flash device during a low-power suspend mode, the USB low-power host not polling the low-power USB device in response to a not-yet signal sent by the low-power USB flash device to reduce power consumption of the USB low-power host.

13. The USB low-power host of claim 12 wherein the first pair is a transmit pair for the low-power host and the first pair is a receive pair for the low-power USB flash device;
 wherein the second pair is the transmit pair for the low-power host and the second pair is the receive pair for the low-power USB flash device;
 wherein the device low-power physical layer and the host low-power physical layer each comprise:
  a driver for driving the transmit pair;
  a bit stuffer for inserting a stuffed bit causing a signal transition on the transmit pair, the bit stuffer inserting the stuffed bit into a data stream after a predetermined number of bits that do not cause the signal transition occur in a sequence.

14. The USB low-power host of claim 13 wherein the device low-power physical layer and the host low-power physical layer each further comprise:
 a sync pattern generator, for generating 9-bit framing symbols representing framing patterns; and
 a NRZI encoder, receiving the data stream and the stuffed bit from the bit stuffer, and receiving the 9-bit framing symbols from the sync pattern generator, for generating transmit data applied to the driver in a Not-Return-to-Zero-Inverse (NRZI) format.

15. The USB low-power host of claim 14 wherein the device low-power physical layer and the host low-power physical layer each further comprise:
 a bit clock, applied to the NRZI encoder and the bit stuffer, for clocking bits of the data stream;
 a clock divider, receiving a core clock, for reducing a frequency of the core clock to generate the bit clock, wherein the bit clock operates at a lower frequency than a bit clock for a standard USB protocol;
 a receiver for detecting signal transitions on the receive pair;
 a sync pattern detector for detecting sync patterns received by the receiver;
 a NRZI decoder for generating a received data stream from the signal transitions detected by the receiver;
 a stuffing remover for removing stuffed bits from the received data stream to generate an extracted data stream;
 a receive clock recovery circuit, coupled to the receiver, for generating a received bit clock from the signal transitions detected by the receiver;
 a serial-to-parallel converter, clocked by the received bit clock, for converting the extracted data stream to received data bytes; and
 an elastic buffer for storing the received data bytes.

16. The USB low-power host of claim 13 wherein the device low-power link layer and the host low-power link layer each comprise link means for generating and processing link control words for controlling link power and for link training;
 wherein the device scaled-down protocol layer and the host scaled-down protocol layer each comprise chaining direct-memory access (DMA) means for pointing to headers and payloads in a memory buffer for transfer to the low-power link layer.

17. The USB low-power host of claim 13 wherein the low-power host further comprises:
 a host USB port connected to a third pair and to a fourth pair of lines;
 a host USB controller, coupled to the host USB port and to the Input-Output processor, for accessing a plurality of USB devices connected to the host USB port;
 wherein the host USB controller comprises:
  a host physical layer coupled to the host USB port;
  a host link layer coupled to the host physical layer;
  a host protocol layer coupled to the host link layer;
  whereby the low-power host connects to the plurality of USB devices through the host USB port and to the low-power USB flash device through the device low-power USB port.

18. The USB low-power host of claim 17 wherein 8-bit stuffed bytes and 9-bit framing symbols are transmitted over the first pair of lines when the low-power host reads the low-power USB flash device and wherein the host USB controller is a USB 3.0 controller and wherein the host simplified low-power USB controller is not fully compatible with USB 3.0.

19. The USB low-power host of claim 13 wherein the low-power USB flash device comprises a single flash device;
wherein the host low-power USB port is connected to only one flash device;
wherein the first pair connects only to the host low-power USB port and to the device low-power USB port;
wherein the second pair connects only to the host low-power USB port and to the device low-power USB port,
whereby the host low-power USB port has only a single endpoint flash device.

20. A low-power card reader comprising:
a Universal-Serial-Bus (USB) port for connecting to a host over a receive pair and a transmit pair of lines;
wherein the receive pair and the transmit pair together comprise a set of two pairs of differential serial buses, a first pair bus with a first pin carry+signal and a second pin carry−signal, and a second pair differential serial bus with a first pin carry+signal and a second pin carry−signal;
a physical layer coupled to the USB port to receive a received data stream from the receive pair, and to transmit a transmit data stream to the transmit pair;
wherein the physical layer further comprises:
an 8/10-bit encoder/decoder for converting 10-bit symbols from the received data stream into 8-bit received data bytes, and for converting 8-bit transmit data bytes into 10-bit transmit symbols to form the transmit data stream;
a descrambler for descrambling the 8-bit received data bytes and for scrambling the 8-bit transmit data bytes;
a cyclical-redundancy-check (CRC) generator/checker for generating a CRC for the 8-bit transmit data bytes, and for checking a CRC for the 8-bit received data bytes;
a link layer, coupled to the physical layer, for processing link control words received from the host over the receive pair, for controlling link power and link training;
a command buffer, coupled to the link layer, for storing commands and data passed through the link layer;
a low-power link layer, coupled to the command buffer;
a low-power physical layer, coupled to the low-power link layer, the low-power physical layer comprising:
a sync pattern generator for generating 9-bit symbols representing framing patterns;
a bit stuffer for inserting a stuffed bit causing a signal transition on a flash pair of lines, the bit stuffer inserting the stuffed bit into a flash data stream after a predetermined number of bits that do not cause the signal transition occur in a sequence;
a NRZI encoder, receiving the flash data stream and the stuffed bit from the bit stuffer, and receiving the 9-bit symbols from the sync pattern generator, for generating flash data in a Not-Return-to-Zero-Inverse (NRZI) format;
a RAM buffer coupled to a scaled-down protocol layer, for storing output parallel words read from a flash memory by a flash interface, and for storing input parallel words before writing to the flash memory by the flash interface; and
a microcontroller coupled to receive addresses, commands, and data from the scaled-down protocol layer, for generating flash commands for accessing the flash memory, the microcontroller generating a not-yet signal that is transmitted to the host over the transmit pair when the RAM buffer does not yet contain requested data that is waiting to be read from the flash memory,
whereby the not-yet signal is transmitted over the transmit pair when the requested data is waiting to be read from the flash memory.

21. The low-power card reader of claim 20 further comprising:
a read-only memory (ROM) for storing device-control instructions;
a device processor for executing the device-control instructions;
a random-access memory (RAM) buffer for storing data for transfer; and
a direct-memory access (DMA) engine, programmed by the device processor, for transferring data between the RAM buffer and the physical layer, the link layer, the command buffer, the low-power physical layer, and a flash memory controller.

22. The low-power card reader of claim 20 wherein the link layer further comprises:
a sequence number generator for generating sequence numbers for link packets;
a CRC generator/checker for generating and checking link CRC's;
a link power manager, responsive to link control words from the host, for managing link power on the transmit pair; and
a link trainer, responsive to link training patterns from the host, for configuring the receive pair and the transmit pair.

* * * * *